United States Patent [19]
Robinson et al.

[11] Patent Number: 5,577,933
[45] Date of Patent: *Nov. 26, 1996

[54] WATTHOUR METER MOUNTING APPARATUS WITH SAFETY SHIELD

[75] Inventors: Darrell Robinson, Highland Township; Robert O. Learmont, Walled Lake; Karl R. Loehr, Novi; Robert Goozen, St. Clair; Michael E. Lewis, Ann Arbor; Allen V. Pruehs, Howell, all of Mich.

[73] Assignee: Ekstrom Industries, Inc., Farmington Hills, Mich.

[*] Notice: The term of this patent shall not extend beyond the expiration date of Pat. No. 5,571,031.

[21] Appl. No.: 521,009

[22] Filed: Aug. 30, 1995

Related U.S. Application Data

[63] Continuation of Ser. No. 215,915, Mar. 22, 1994, abandoned.

[51] Int. Cl.⁶ ................................................ H01R 33/945
[52] U.S. Cl. ........................................ 439/517; 439/508
[58] Field of Search .......................... 439/146, 167, 439/517, 508; 361/659, 668

[56] References Cited

U.S. PATENT DOCUMENTS

| | | |
|---|---|---|
| Re. 34,531 | 2/1994 | Bell et al. . |
| 2,030,522 | 2/1936 | Johansson ............... 439/508 X |
| 3,061,763 | 10/1962 | Ekstrom . |
| 3,221,216 | 11/1965 | Kobryner ............... 439/167 X |
| 4,772,213 | 9/1988 | Bell et al. . |
| 4,823,572 | 4/1989 | Signorelli . |
| 4,892,485 | 1/1990 | Patton ................... 439/517 X |
| 5,088,004 | 2/1992 | Howell .................. 439/517 X |
| 5,145,403 | 9/1992 | Schaffert et al. . |
| 5,181,166 | 1/1993 | Howell .................. 439/517 X |
| 5,207,595 | 5/1993 | Learmont et al. . |

OTHER PUBLICATIONS

Grote & Hartmann, Product Catalog, 1993.

Long Life For Power Contacts, Machine Design, Jan. 11, 1990.

Series Reconnect Device Series SRD–S1900, Scientific Atlanta Instrumentation Group, 1992.

*Primary Examiner*—Samuel M. Heinrich
*Assistant Examiner*—Daniel Wittels
*Attorney, Agent, or Firm*—Young and Basile P.C.

[57] ABSTRACT

A watthour meter mounting apparatus, such as a socket, socket adapter and the like, has a safety shield completely enclosing the jaw contacts of the apparatus. Slots are formed in the safety shield to allow the insertion of a watthour meter blade terminal therethrough into connection with the jaw contacts. In one embodiment, a socket adapter housing includes front and back plates which are joined together and form a cavity therebetween in which the jaw terminals and the electrical conductors are disposed. Raised receptacles formed in the first plate loosely receive the jaw contacts mounted on one end of the conductors. In another embodiment, an insulating housing is mounted over the jaw contacts in a socket or socket adapter, with slots formed in the housing to allow the insertion of a watthour meter blade terminal therethrough into a jaw contact disposed within the housing. The housing may be formed with one large cavity surrounding all of the jaw terminals or a plurality of separate receptacles, each surrounding at least one jaw contact. The conductors may be formed of rigid bus bar for increased current carrying capability. Each jaw contact can be formed of separate contact clips biased toward each other by separate spring clips riveted to one end of each conductor. A terminal slidably receives the other end of each conductor as well as a line/load external conductor.

90 Claims, 18 Drawing Sheets

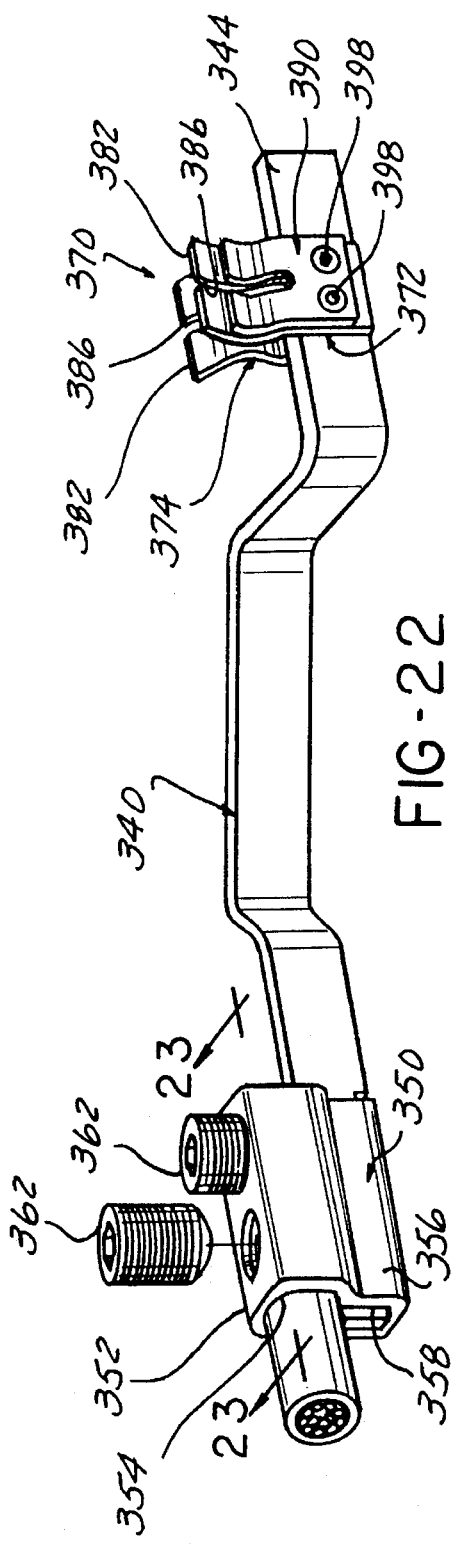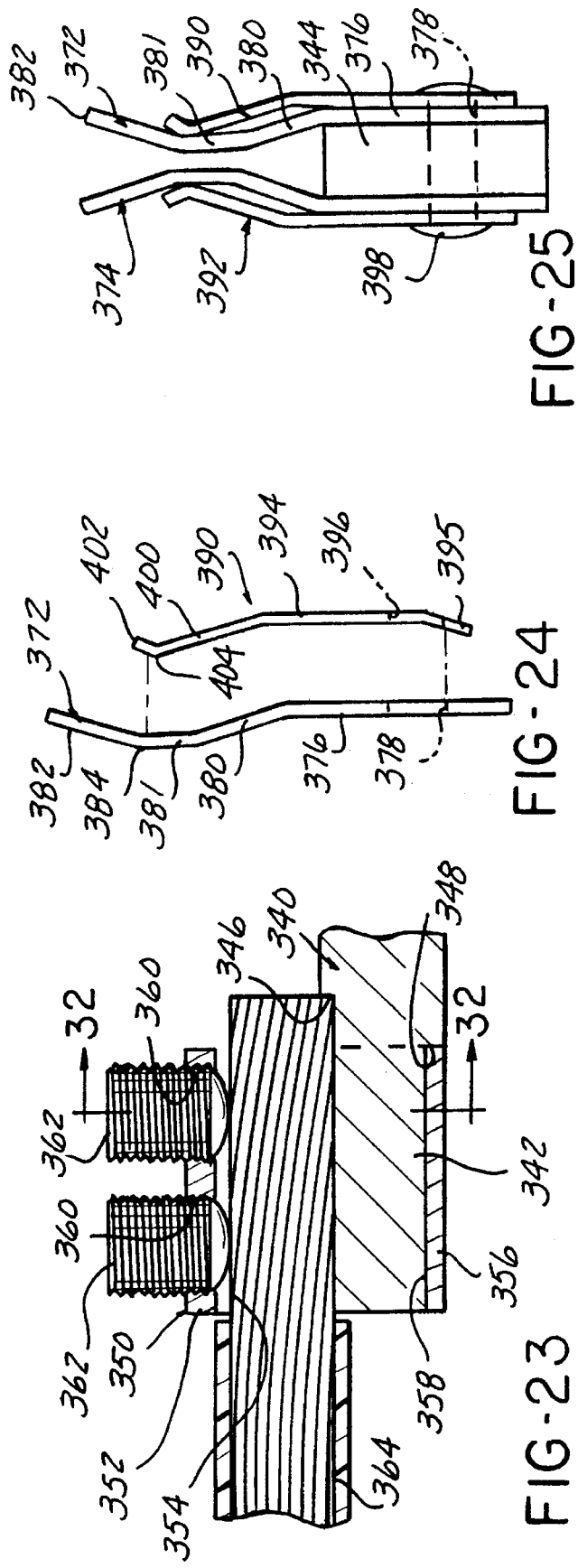

WATTHOUR METER MOUNTING APPARATUS WITH SAFETY SHIELD

This application is a Continuation of application Ser. No. 08/215,915, filed on Mar. 22, 1994 now abandoned.

CROSS-REFERENCE TO RELATED APPLICATION

This application describes and illustrates subject matter which is claimed in a related application filed concurrently herewith, in the names of Darrell Robinson et al and entitled "WATTHOUR METER MOUNTING APPARATUS WITH IMPROVED ELECTRICAL CONNECTIONS".

BACKGROUND OF THE INVENTION

The present invention relates, in general, to electrical watthour meters and, more specifically to watthour meter mounting enclosures.

In the electric utility industry, plug-in, socket-type watthour meters are commonly employed to measure electrical power consumption at a residential or commercial building establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts receive blade terminals on a plug-in watthour meter to complete an electric circuit through the meter between the line and load terminals mounted in the cabinet for the measurement of electrical power consumption.

S-type, socket-type, plug-in watthour meters have replaced older A base bottom connected meters which were formed of a single piece housing in which the watthour meter was fixedly mounted along with compression terminals which provide connection to the utility power lines and the building load distribution network.

In a installation involving an A-type bottom connected meter, an A to S socket adapter is used to allow a new S-type watthour meter to be installed. The socket type meter has outwardly extending blade terminals which are insertable into the jaw contacts in the cabinet of a S-type meter socket. The socket adapter includes its own set of female jaw contacts which receive the male blade terminals of the S-type plug-in, socket-type meter.

A socket extender adapter used to convert a ringless style socket to a ring-type socket has a similar arrangement of contacts and terminals to plug-in to a socket and to receive an S-type, plug-in, socket-type meter.

While it is typical for a watthour meter, once it is installed in a socket or socket and socket adapter, to remain in service for many years, it is still necessary for such meters to be removed for repair or replacement from time to time as well as to temporarily disconnect electrical service to a particular customer. During the installation and removal of the watthour meter from the socket or socket adapter, the electric power line terminals in the socket or socket adapter remain connected to the electric utility power line conductors and carry potential. The utility employee installing or removing the watthour meter may inadvertently touch such contacts thereby raising the possibility of injury. Furthermore, an inadvertent short across the contacts caused by a tool contacting the contacts or a full fault caused by a 90° offset insertion of the meter can cause a spark or flash which could damage the watthour meter installation as well as posing a significant risk of injury to the utility employee. Various flash covers or shields have been devised as separate attachments to cover a portion of the jaw contacts in a watthour meter socket or socket adapter. One type of flash cover or shield is shown in FIG. 16 and comprises a clip formed of an electrically insulating material which snaps over the outer end of a jaw contact to cover the outermost portions of the jaw contact. The clip includes a central slot or aperture which is aligned with the slot between the two spring legs of the jaw contact to allow insertion of a watthour meter terminal into the jaw contact while the clip is still attached to the jaw contact.

A more elaborate flash cover or shield is shown in FIG. 17. This type of flash shield is formed with a flat front cover containing slots which are aligned with the jaw contacts and receive the watthour meter terminals therethrough. Rearward facing legs extend from the upper and lower portions of the cover and space the cover from the back wall of the socket or socket adapter.

Both types of flash or safety shields provide some measure of flash protection in that they cover a portion of the jaw contacts thereby minimizing the possibility of inadvertent contact with such contacts by the utility employee or portions of the meter during installation or removal of the meter from the socket or socket adapter. However, such previously devised flash covers or shields do not completely surround all exposed portions of the jaw terminals. Thus, such exposed portions may still be inadvertently touched by a utility employee or, in the event of a fault or a short, a spark or flash could still occur.

Thus, it would be desirable to provide a safety shield for an electrical watthour meter apparatus which completely encloses all portions of the jaw contacts in a watthour meter mounting device, such as a socket, socket adapter, socket extender, etc., to prevent inadvertent contact with such jaw contacts or to prevent a short between such contacts which could lead to a spark or flash. It would also be desirable to provide such a safety shield which can be easily incorporated into the design of a new watthour meter socket, or other meter mounting device, socket adapter, or installed as a separate component in an existing watthour meter socket or socket adapter.

In watthour meter socket adapters, solid or stranded conductors are connected between the jaw contacts and the terminals. While such conductors can be easily formed to the desired shape so as to extend between a jaw contact and a terminal, all polyphase adapter designs have required certain of the conductors to be crossed or overlapped. This feature plus the need to allow clearance for the meter feet have limited the maximum current carrying capacity of such conductors. It would be desirable to provide conductors for watthour meter socket adapters which have increased current carrying capacity while still being easily mounted in the socket adapter.

It would also be desirable to improve the design of the jaw contacts and terminals employed in a watthour meter socket adapter. In previous watthour meter socket adapters, the jaw contacts typically have a folded over design formed of a base wall which is fixedly mounted to the shell of the socket adapter and two spaced side walls extending therefrom. The outer ends of the side walls are folded over inwardly between the side walls and terminate in parallel end flanges which slidably receive a blade terminal of a watthour meter. However, this design presents three different problems.

First, the direction of current flow through the jaw contacts is opposed to the direction of current flow from the jaw contacts through the blade terminal of the watthour meter. That is, current flows in one direction through the folded over portion of the jaw contacts and then in an opposite direction outward from the jaw contacts through the blade terminal. This creates opposed magnetic fields which increase resistance and generate heat and could possibly lead to a less than reliable connection of the blade terminals to the jaw contacts. Thus, it would be desirable to provide a jaw contact design which has less resistance than previous jaw contact designs.

Secondly, the relatively large angle between the folded over portion and the side walls of the jaw contacts requires a high level of force to insert a watthour meter blade terminal into a jaw contact. This is due solely to the angle of the folded over portion of the jaw contacts which generates a sideways force to separate the jaws as well as an axial force to insert the blade terminal through the parallel end portions of the jaw contacts. Thus, it would be desirable to provide an improved jaw contact design for a watthour meter socket adapter which provides reduced insertion force to mount a watthour meter in the socket adapter.

Thirdly, the removal of the blade terminals of a watthour meter from the folded over jaw contacts commonly employed in previous socket adapters also requires a high level of force. Such a high force is difficult to apply to the watthour meter due to the round glass dome on the meter. The high removable force results from the tendency of the folded over portions of the jaw contacts to tighten since the inner folded over ends of the jaws pulls upward during removal of a blade terminals from a jaw contact. Thus, it would be desirable to provide a jaw contact design for a watthour meter socket adapter which requires reduced watthour meter withdrawal forces.

Finally, in previously devised conductors for socket adapters, the jaw contacts have been attached to the conductors by threaded fasteners. This involves labor intensive and costly manufacturing operations in order to prepare the threaded apertures in the conductors and the contacts and to insert and tighten the fasteners. Thus, it would be desirable to provide a conductor and jaw contact design for a watthour meter socket adapter which requires less labor for manufacturing and assembly and thereby has a reduced cost and greater reliability.

SUMMARY OF THE INVENTION

The present invention is an electric watthour meter mounting apparatus which includes a flash or safety shield for completely covering all exposed portions of the jaw contacts in a watthour mounting apparatus to prevent inadvertent contact with such contacts by the utility employee or by a tool which leads to a short circuit or a full fault caused by a 90° offset insertion of the meter, both of which causes a dangerous spark or flash.

In one embodiment, the apparatus includes a housing having a watthour meter receiving portion and a terminal portion spaced from the watthour meter receiving portion. A plurality of electric terminals are mounted in the terminal portion and connected to utility power line conductors and building distribution load conductors. A plurality of jaw-type electrical contacts are mounted in the watthour meter receiving portion, each jaw contact receiving a blade terminal of a watthour meter in a snap-in connection. Electrical conductors are connected between the jaw contacts and the terminals. Means are formed on the housing for completely covering the electrical conductors and the contacts in the housing.

In one embodiment, the housing is formed of first and second plates, one having an annular side wall extending outward therefrom. The first and second plates are spaced apart, when joined together, to define an interior cavity. The electrical conductors are disposed in the cavity and are completely enclosed by the first and second plates and the annular side wall. A plurality of hollow receptacles are formed in the first plate and extend outward from the first plate. The interior of the receptacles opens to the interior cavity between the first and second plates and receive a jaw contact therein. A slot is formed in each receptacle for receiving a blade terminal of a watthour meter therethrough to enable the watthour meter terminal to be inserted into a jaw contact. Each receptacle is formed with closed side walls and an outer end wall to completely surround all portions of the jaw contact housed therein.

The first and second plates are releasably joined together by joining means formed and mounted on the first and second plates. A pair of outwardly extending flanges, each having an aperture therein, are formed on and extend outward from the second plate. The first plate has a pair of clips mounted in spaced recesses which engage the apertures in the flanges on the second plate to releasably join the first and second plates together.

The watthour meter receiving portion on the second plate is formed with a discontinuity in the annular side wall. Annular flange means are formed on the terminal portion of the first plate for forming a continuous extension of the side wall of the terminal portion when the first and second plates are joined together. The annular flange means includes a first annular flange integrally formed with the first plate. A second annular flange is releasably and separably engagable with the first annular flange and, when joined to the first annular flange, fills the discontinuity in the annular side wall of the second plate.

One jaw contact and one terminal are fixedly connected to opposite ends of each of the plurality of electrical conductors. All of the plurality of electrical conductors are arranged in a plane in the interior cavity between the first and second plates. Preferably, due to the insulating enclosure formed by the first and second plates around the conductors, the electrical conductors can be bare conductors without any exterior electrical insulation.

Means are formed on at least one of the first and second plates and extend to the opposite one of the first and second plates for electrically insulating adjacent portions of the conductors from each other. In one embodiment, the insulating means includes a first flange formed on the first plate and extending toward the second plate when the first and second plates are joined together. A second flange is formed on the second plate and extends toward the first plate when the first and second plates are joined together. The first and second flanges on the first and second plates, respectively, are positioned so as to be disposed in close proximity to each other when the first and second plates are joined together to form a barrier between portions of the electrical conductors disposed adjacent to the first and second plates.

The watthour meter mounting apparatus of the present invention also includes a terminal cover which is releasably mountable over the terminal portion of the first plate. Means are provided for releasably mounting the terminal cover to the terminal portion on the first plate. The releasable mounting means preferably includes a pin mounted on and extending outward from the terminal portion of the first plate. A leg is formed on the outer end of the pin and extends laterally of the pin. An aperture is formed in the terminal cover so as to slidably receive the pin therein when the terminal cover is mounted on the terminal portion of the first plate. A flange is formed in the terminal cover within the aperture and extending a predetermined distance across the aperture. The flange and the leg on the pin cooperate to provide a solid exterior surface blocking entry to the interior of the terminal portion of debris when the terminal cover is mounted on the terminal portion of the first plate. Means are also provided for releasably locking the terminal cover on the terminal portion of the first plate.

In another embodiment, the housing is also formed of two releasably attachable housing portions. A first housing portion has a plate with hollow receptacles formed thereon for receiving the jaw contacts attached to one end of the conductors. Angular extending side walls and a front cover filler extend from a lower portion of the plate to the terminal receiving portion of the housing.

The second housing portion also has a plate and an annular side wall extending from one side thereof. An angular discontinuity is formed in the side wall. When the first and second housing portions are joined together, the respective plates of the first and second housing portions are spaced apart to form an interior cavity within the housing for receiving the electrical conductors.

In this embodiment, a rim filler is formed on the plate of the first housing portion and is arcuately arranged and sized to fill the discontinuity in the side wall of the second housing portion. A rim filler extension is removably attached to the rim filler by means of interlocking projections and tabs formed on the rim filler and the rim filler extension. Both of the rim filler and the rim filler extension have aligned slots formed therein which cooperate when the rim filler extension is mounted on the rim filler to form openings extending through the interconnected rim filler and rim filler extensions for the passage of auxiliary wires from the first housing portion to the terminal mounting portion.

A ground surge ring is mounted on the first housing portion in proximity with the annular side wall of the second housing portion. The ground surge ring has an annular portion which terminates in a pair of mounting flanges which extend from opposite ends of the annular portion to overlay the front cover filler of the first housing portion which extends below the rim filler. Apertures are formed in the mounting flanges for receiving fasteners for attaching the ground surge ring to the first and second housing portions. A flange extends perpendicularly from one of the mounting flanges and passes through an aperture formed in a terminal cover. The perpendicular flange is located in proximity to the rim filler extension to enable a single wire seal to be passed through an aperture in the perpendicular flange and an aperture in a flange on one end of a sealing ring to seal both the sealing ring and the terminal cover.

The terminal cover is formed with opposed sides and a front wall which has an arcuate shaped rim edge. The rim edge of the terminal cover, when the terminal cover is mounted on the first housing portion, is disposed in proximity with an annular rim edge of the rim filler extension and disposes the front wall of the terminal cover extending from the rim edge below the mounting flange of the rim filler extension to enable the placement of a sealing ring and barrel lock thereon. In this configuration, the barrel lock of the sealing ring closely overlays the front wall of the terminal cover to prevent removal of the terminal cover from the first housing portion.

A pair of spaced channels are formed on opposite sides of the front wall of the terminal cover and open in a direction facing the terminal mounting portion of the housing to enable auxiliary wires from the first housing portion to pass therethrough to connections external of the housing. The channels with or without supporting ribs also act as a stop means to limit the angular movement of the barrel lock on the sealing ring to a minimal amount over the front wall of the terminal cover.

The front wall of the terminal cover, when the terminal cover is mounted on the first housing portion, is spaced from the front cover filler of the first housing portion to form a channel therebetween which communicates with the apertures formed between the interconnected rim filler and rim filler extension to enable auxiliary wires to pass from the first housing portion to the channels in the terminal cover.

In either embodiment of the present invention, the electrical conductors connected between the jaw contacts and the terminals may comprise polygonal shaped bus bars. The bus bars are formed into predetermined shapes so as to be spaced apart along their entire length from adjacent conductors and not to require external insulation.

The terminals preferably comprise a collar having first and second spaced, axially extending first and second bores. An external electrical power line or load conductor is secured in the first bore in the collar by means of fasteners extendible through the collar into engagement with one end of the external conductor. The second bore receives a first end of one of the bus bar conductors. Preferably, first and second opposed steps are formed in the first end of the conductor to limit the length of insertion of the conductor into the collar. One of the steps also limits the length of insertion of the external power line or load conductor into the first bore in the collar.

In either embodiment, the jaw contacts preferably comprise first and second contact clips which are spacably disposed in registry with opposite sides of the bus bar conductor. Biasing means are disposed in engagement with each of the first and second contact clips for biasing one end of each of the first and second contact clips toward each other. Means are provided for fixedly joining the first and second contact clips and the biasing means to the electrical conductor.

Preferably, the biasing means comprises first and second spring clips which are respectively disposed in registry with the first and second contact clips. Each of the first and second spring clips comprises a plate-like member having a planar central portion and a first end portion extending at a predetermined angle from one end of the central portion. An intermediate portion extends at a predetermined angle from an opposite end of the central portion in the same direction as the first end portion away from the plane of the central portion. A second end portion extends at a predetermined angle from the intermediate portion toward the plane of the central portion.

Likewise, each of the first and second contact clips comprises a plate-like member having a planar first end portion, an intermediate portion extending at a predetermined angle from the plane containing the first end portion and a second end portion extending at a predetermined angle from an end of the intermediate portion. The angle of the second end portion from the intermediate portion is selected so as to provide a minimal blade terminal insertion force. Preferably, the second end portion extends at a 15° angle from a plane extending through a conductor juncture formed between the second end portion and the intermediate portion and parallel to the plane containing the first end portion of each contact clip.

Either of the above-identified embodiments may also include additional potential contacts. The potential contacts are connected to the leads extending from the potential coil(s) in the watthour meter and are loosely disposed in separate receptacles formed in the first plate of the housing. Such contacts are formed with two spaced legs extending outward from a base to which a potential lead is attached. In one embodiment, one leg is formed of two spaced legs with an opposite leg interposed between the two spaced legs and extending outwardly in an opposite direction to form a slot for receiving the current lead therein.

In another embodiment, an A to S type socket extender adapter includes a housing having a base and an annular side wall extending outward from one side of the base. A plurality of electrical jaw contacts are mounted on the base of the housing. Means are mounted in the housing for enclosing substantially all of the jaw contacts mounted therein and for allowing the blade terminals of an electrical apparatus, such as a watthour meter, to be releasably inserted into the jaw contacts. The enclosing means comprises a hollow enclosure formed of an electrically insulating material with four sides, a solid end and an opposed open end which surrounds all of the jaw contacts mounted in the housing. Means are provided for mounting the enclosure in the housing. A plurality of apertures are formed in the enclosure, each aperture located adjacent one of the jaw contacts in the housing to allow insertion of a terminal of an electrical apparatus for watthour meter into a jaw contact in the housing.

In yet another embodiment, the enclosure is in the form of a planar wall mountable on the base of the housing. A plurality of hollow receptacles are formed on the wall and extend outward from the wall away from the base of the housing. At least one aperture is formed in each receptacle for receiving the terminal of an electrical device or watthour meter therethrough, the aperture being located adjacent one of the jaw contacts in the housing when the enclosure is mounted to the housing.

The present invention provides a unique watthour meter mounting apparatus containing a safety shield which completely surrounds all exposed portions of the jaw contacts mounted in a watthour socket, socket adapter or related device. The safety shield of the present invention prevents any inadvertent contact by a utility person with the contacts during installation or removal of the meter from the socket or socket adapter as well as any opportunity for a short circuit or full fault to occur between two contacts which could result in a potentially dangerous spark or flash between the jaws.

The first and second embodiments of the present invention containing first and second separably joinable plates or housing portions not only provides the unique safety or flash shield characteristics described above, but, also, the electrical conductors extending between the line and load terminals and the jaw contacts in the housing are completely encased between the first and second plates. Since the jaw contacts attached to one end of the conductors are insertable into the receptacles formed in the first plate, separate fixed mounting of the jaw contacts to the watthour meter mounting housing is eliminated thereby reducing material costs and labor. Further, the conductors may be installed without any external insulation since the dividers or barriers formed on the first and second plates provide the necessary electrical insulation between adjacent conductors as well as the long flash distance required by electrical utility standards for watthour meter apparatus.

Certain embodiments of the present invention provide a simple and expedient means for providing a safety shield around the jaw contacts in a socket adapter or related watthour meter apparatus, such as a socket extender, for example, which encloses all of the exposed portions of the jaw contacts. The one large enclosure disclosed in one embodiment of the present invention which has a single large internal recess surrounding all of the jaw contacts is easily mounted within a watthour meter socket adapter, socket extender or socket. In the other embodiment in which a plurality of receptacles extend from a planar wall mountable within the socket adapter or socket extender, the receptacles also enable the jaw contacts to be mounted within such electrical apparatus without the need for separate fasteners, such as cotter pins, as employed in previously devised socket adapters or socket extenders. This results in a safer watthour meter mounting apparatus as well as a watthour meter mounting apparatus having reduced manufacturing costs.

The unique conductor, jaw contact and terminal design of the present invention provides significant advantages over previously devised conductor, jaw contacts and terminals employed in watthour meter socket adapters. The rigid bus bar used to form the conductors provides a higher current carrying capacity than the previously employed solid or stranded wire conductors and is rigid enough to support contact push-in and pull-out force requirements thus eliminating the need to fasten the contacts in the housing of the socket adapter. The unique jaw contacts formed of separate jaw clips provide a secure connection to a watthour meter or other electrical apparatus. The separate spring clips engaging each contact clip bias the contact clips toward each other for a secure connection. This results in higher reliability and, due to the simplified design of the contact clips and the spring clips, contributes to a reduced manufacturing cost for the watthour meter socket adapter.

Further, due to the angular end portion design of the contact clips and the general elongated, linear extent of the contact clips, current flow from the electrical conductors to the end of the contact clips and from the contact clips to the blade terminals of a watthour meter inserted therein is in the same direction. This prevents the generation of opposing magnetic fields as in previously devised folded over jaw contacts so as to reduce resistance and heating and providing a more reliable connection between the jaw contacts and the blade terminals of a watthour meter.

The spring clips and contact clips are fixedly secured to the bus bar conductor by rivets thereby eliminating the need for labor intensive and costly threaded fasteners and apertures as previously employed in socket adapters. The riveted connections also provide a more secure and reliable attachment of the jaw contacts to the conductors. In addition, the spring clips provide a unique dual function of maintaining pressure on the contact clips at their attachment to the bus bar conductor as well as to the blade terminal when it is inserted into the contact clip.

Finally, the unique contact design having a generally planar configuration with a predetermined angular disposed end portion substantially reduces the insertion forces required to slidably insert the blade terminals of a watthour meter into the jaw contacts. At the same time, such contacts require less withdrawal forces to remove a watthour meter therefrom.

BRIEF DESCRIPTION OF THE DRAWING

The various features, advantages and other uses of the present invention will become more apparent by referring to the following detailed description and drawing in which:

FIG. 22 is a perspective view of an electrical conductor, jaw contact and terminal employed in the apparatus shown in FIG. 21;

FIG. 23 is an enlarged, side elevational, cross sectional view of the connection between an external conductor, the terminal and the conductor shown in FIG. 22;

FIG. 24 is an exploded, enlarged, side elevational view of one contact clip and one spring clip shown in FIG. 22;

FIG. 25 is an enlarged, end elevational view of the jaw contact shown in FIG. 22;

DESCRIPTION OF THE PREFERRED EMBODIMENTS

Figure 1:
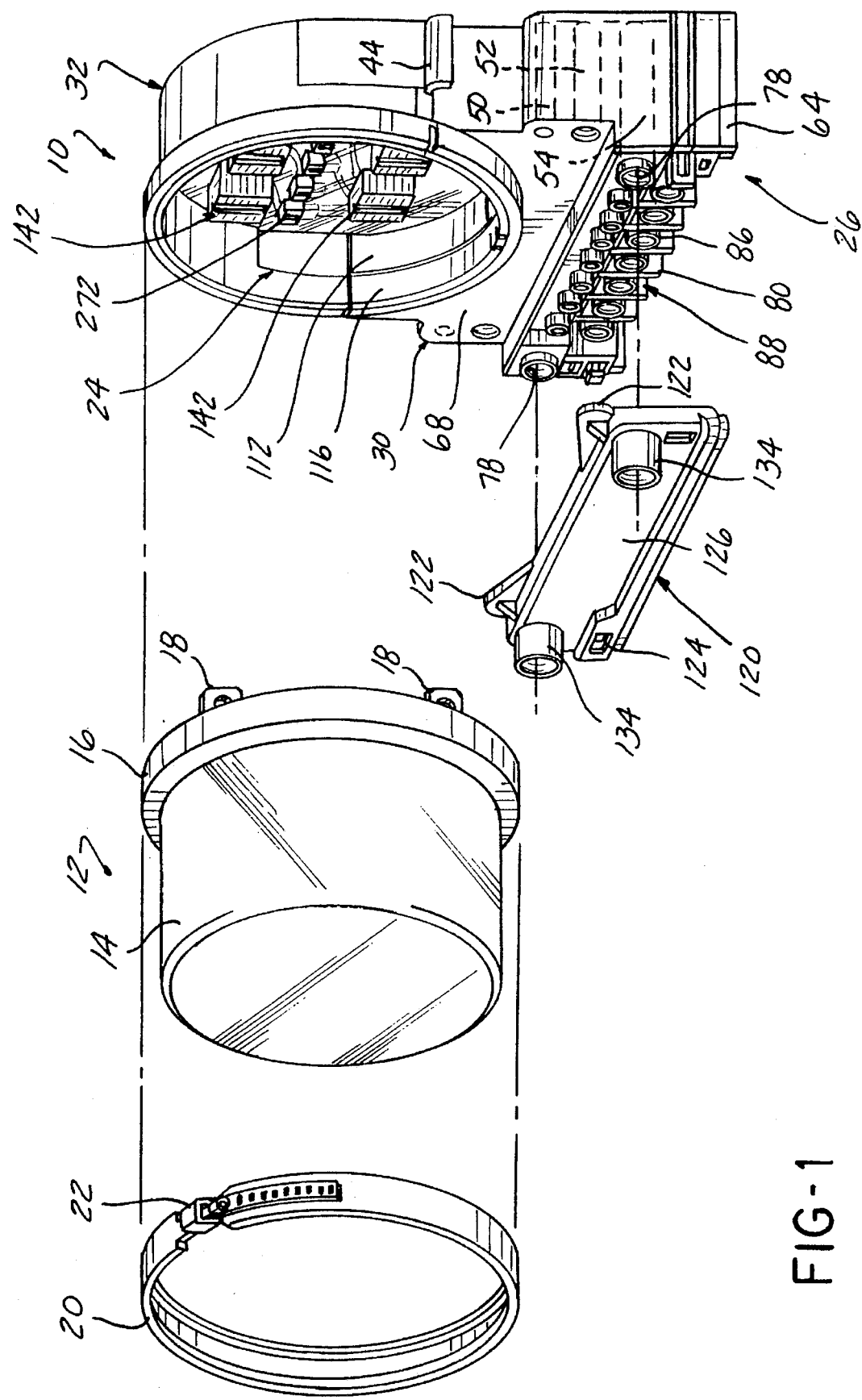
FIG. 1 is an exploded perspective view of a watthour meter mounting apparatus according to one embodiment of the present invention.

Referring now to the drawing, there is depicted an electrical watthour meter mounting apparatus such as a socket or socket adapter having a unique flash shield which completely covers all exposed portions of the jaw contacts which receive the blade terminals on a conventional watthour meter.

The present flash shield is usable with a wide variety of electrical watthour meter apparatus, such as socket, socket adapters, socket extenders, etc. The following description showing a bottom connected type watthour meter socket adapter is provided by way of example only. As shown in FIG. 1, a polyphase socket and bottom connected meter to socket meter adapter 10 receives a conventional, socket-type watthour meter 12 is a push-in, snap-in connection. As is well known, the socket-type watthour meter 12 includes a cover 14 which encloses the internal mechanism and gages of the watthour meter 12. An annular mounting flange 16 extends radially outward from the base of the watthour meter 12 and provides a mounting connection to the socket adapter 10, as described hereafter. A plurality of blade terminals 18, only two of which are shown in FIG. 1, are provided in a predetermined number and arrangement depending upon the type of electrical service provided to a customer, i.e., single phase, three phase, etc. Blade terminals 18 extend outward from the base of the watthour meter 12 and respectively engage jaw contacts in the socket adapter 10, as described hereafter.

As is also conventional, a sealing ring 20 is provided to releasably enclose the mounting flange 16 of the watthour meter 12 and the corresponding mounting flange on the socket adapter 10, as described hereafter, to sealingly mount the watthour meter 12 on the socket adapter 10. The sealing ring 20 is in the form of an annular band having a generally U-shaped cross section. The sealing ring 20 is sized to sealingly engage opposite sides of the mounting flange 16 on the watthour meter 12 and the corresponding mounting flange on the socket adapter 10. A lock device, such as a seal ring lock 22 is provided on the free ends of the sealing ring 20 for locking the ends of the sealing ring 20 about the mounting flanges on the watthour meter 12 and the socket adapter 10.

The socket adapter 10, by way of example only, is depicted as a bottom type socket adapter having a watthour meter receiving portion denoted generally by reference number 24 and an adjacent terminal portion 26. The watthour meter receiving portion 24 surrounds the jaw contacts which receive the blade terminals 18 of a watthour meter 12. The terminal portion 26, as described in greater detail hereafter, provides terminal connection to the electric utility company line conductors and the building or residence load distribution network.

As shown in FIGS. 1–5, the socket adapter 10 is formed of a two part housing consisting of a first or front portion 30 and a second or back portion 32.

Figure 3:
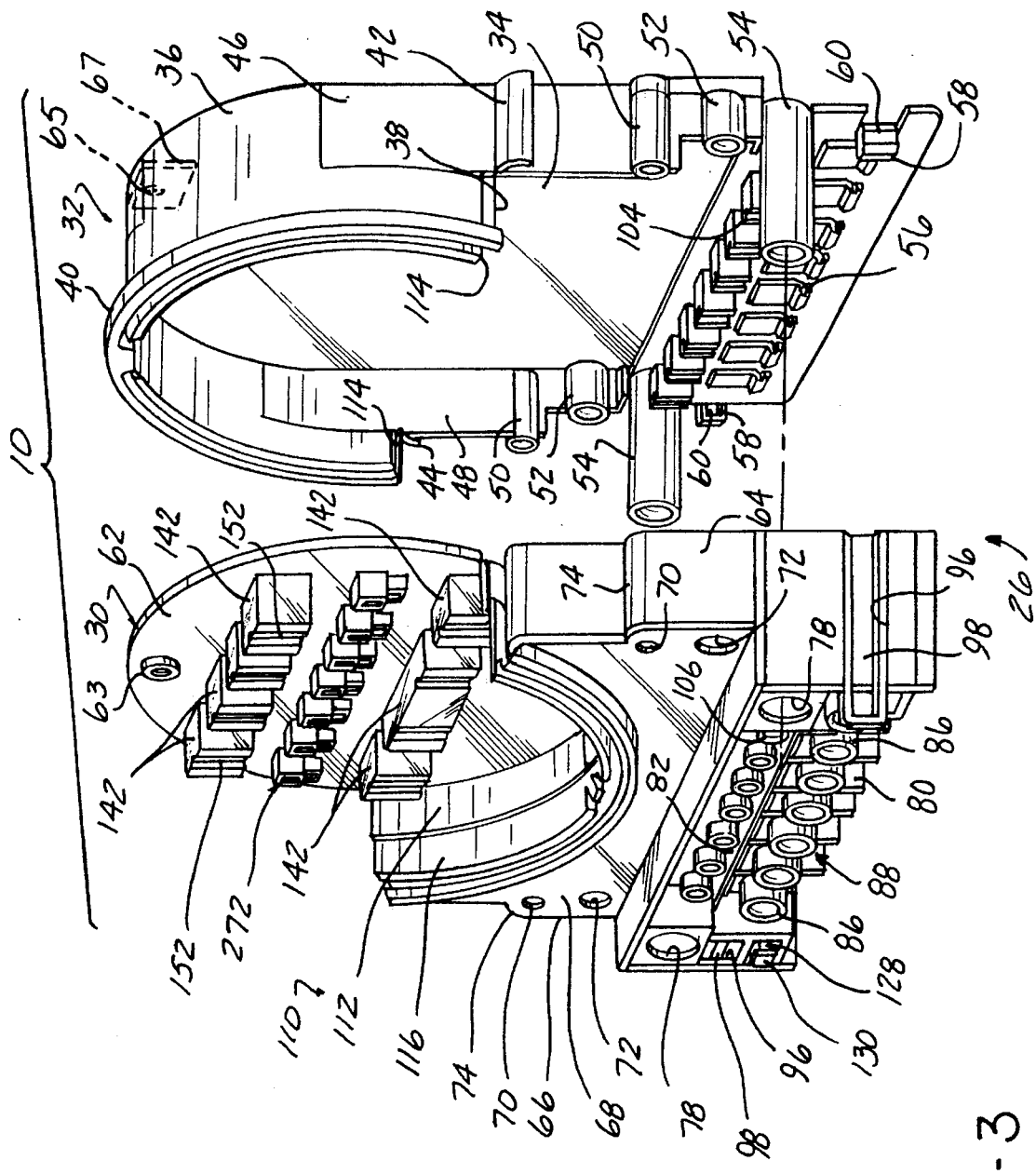
FIG. 3 is an exploded perspective view of the first and second plates of the embodiment shown in FIG. 1.

The second or back portion 32, as shown in FIGS. 1 and 3, is formed of an electrically insulating material, such as a suitable plastic. The second portion 32 includes a planar base or plate 34 having an annular side wall 36 extending outward from one surface thereof. The annular side wall 36 has a discontinuity 38 formed at a predetermined portion which extends over a predetermined angular extent of the side wall 36 adjacent to the terminal portion 26 of the socket adapter 10. The side wall 36 terminates in an radially extending, annular flange or mounting rim 40.

A pair of spaced, arcuate flanges 42 and 44 are formed intermediately on opposite sides of the base or plate 34 on planar side wall extensions 46 and 48, respectively. The flanges 42 and 44 have an outer end spaced from the respective side wall extension 46 and 48 and provide mating engagement with a corresponding surface on the front portion 30, as described hereafter, when the front and back portions 30 and 32 are joined together.

Also formed on the back plate 34 are a number of pairs of cylindrical, hollow tubular posts. The first pair of posts denoted by reference number 50 are spaced from the intermediate flanges 42 and 44 and extend outward from the base 34. A second pair of cylindrical posts 52 are spaced from the first pair of posts 50 at the approximate end of the side wall extensions 46 and 48. The first pair of posts 50 align with apertures formed in the front portion 30, as described hereafter, to receive fasteners to join the front and back portions 30 and 32 together. A third pair of elongated cylindrical posts 54 are also formed on the plate 34 and are alignable with corresponding apertures in the front portion 30 to receive a barrel lock to lockably mount a terminal cover, described hereafter, on the socket adapter 10.

A plurality of pads 56 are formed on a lower portion of the plate 34 and are designed to support the line and load terminals mounted in the front portion 30, as described hereafter. Finally, a pair of outwardly extending flanges 58, each having a central aperture 60 formed therein, are formed on the plate 34 below the elongated pair of posts 54. The flanges 58 are designed to receive joining clips mounted in the front portion 30 to releasably join the front and back portions 30 and 32 together, as described in greater detail hereafter.

Figure 2:
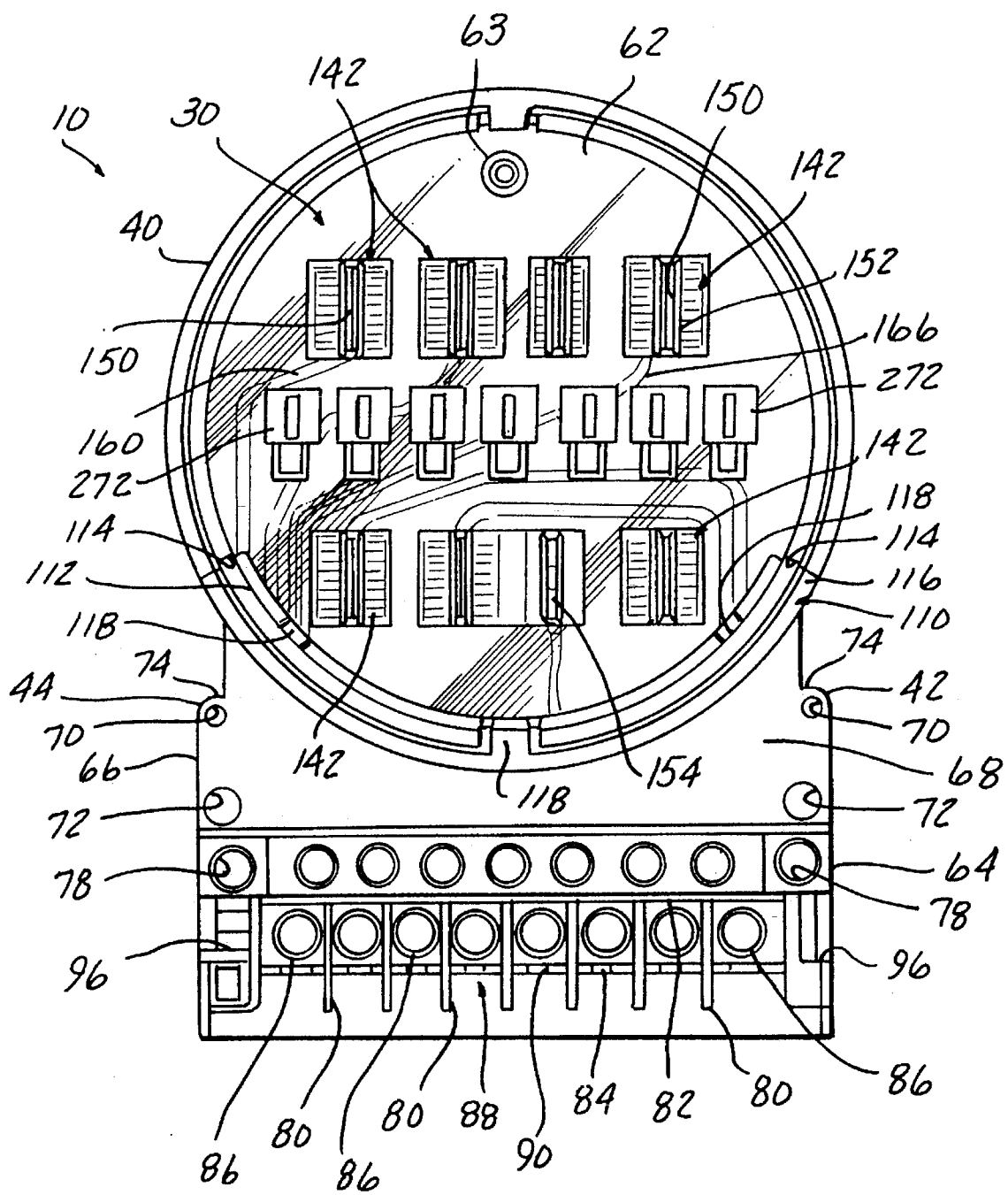
FIG. 2 is a front elevational view of the watthour meter mounting apparatus shown in FIG. 1.
Figure 5:
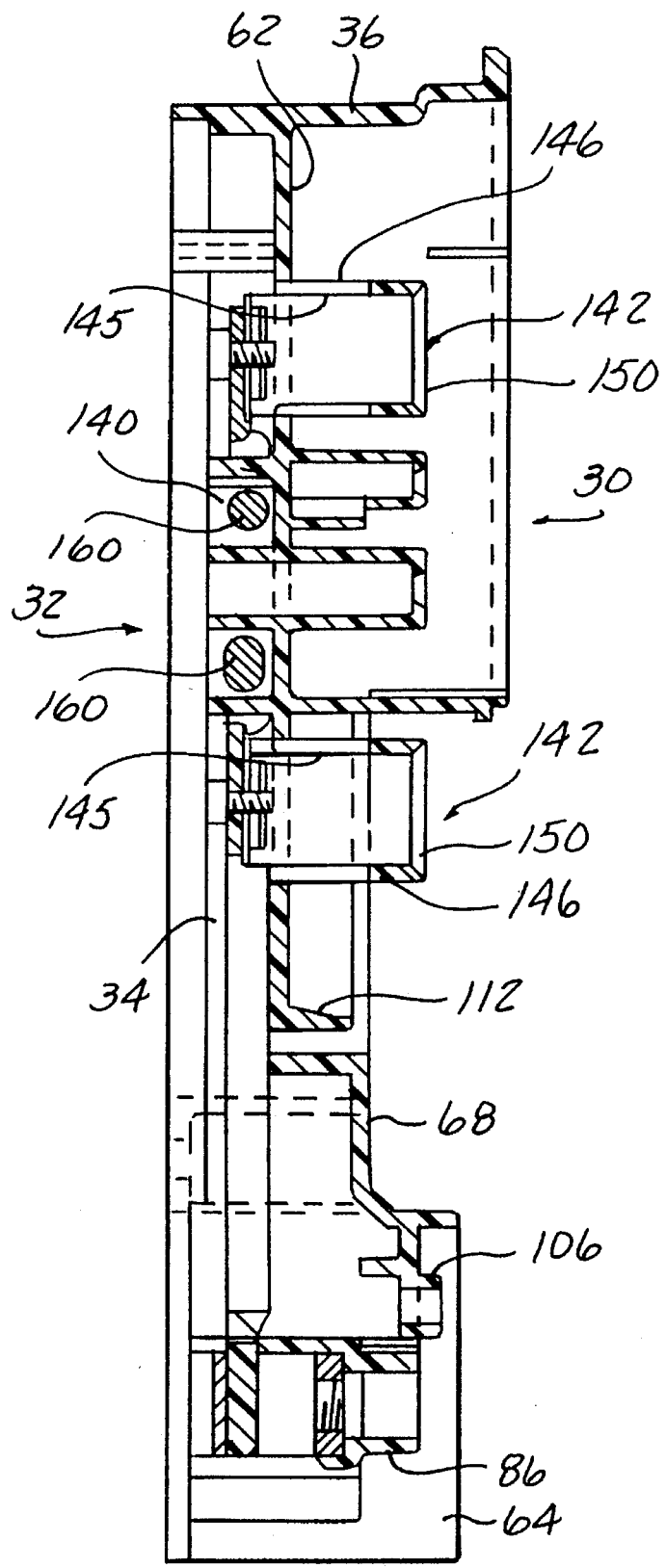
FIG. 5 is a cross sectional view generally taken along line 5—5 in FIG. 4.

A detailed construction of the front portion 30, shown generally in FIG. 1, is depicted in greater detail in FIGS. 2, 3 and 5. As shown therein, the front portion 30 includes a base or plate 62 generally having an annular or circular shape. The base 62 is sized to slidably fit within the annular side wall 36 of the back portion 32 of the socket adapter 10. A cylindrical sleeve 63 is mounted in an aperture at the top portion of the base 62 and has a hollow bore extending therethrough. The bore is alignable with a bore 65 in a hanger pad 67 mounted at the top of the base 34 of the back portion 32. A fastener, not shown, is insertable through the aligned bores to mount the adapter 10 on a wall or other support surface. A conventional hanger, also not shown, may also be used.

A pair of flanges 64 and 66 are integrally formed with and extend from opposite sides of the annular base 62 away from the base 62. A front filler 68 extends between the flanges 64 and 66 immediately below the annular base 62 and is integrally formed with the flanges 64 and 66.

A first pair of apertures 70 are formed in the front filler 68 and are alignable with the first pair of cylindrical posts 50 on the back portion 32. A second pair of apertures 72 are also formed in the front filler 68, spaced from the first pair of apertures 70. The first pair of apertures 70 are alignable with the first pair of cylindrical posts 50 in the back portion 32 and receive suitable fasteners, such as screws, therethrough to releasably join the front and back portions 30 and 32 of the socket adapter 10 together and to mount the adapter 10 on a wall or other support surface.

As shown in FIGS. 2 and 3, the side flanges 64 and 66 include an intermediate, annular shoulder 74 which is designed to slidably engage the exterior surface of the first pair of cylindrical posts 50 on the back portion 32 to align the front and back portions 30 and 32. The side flanges 64 and 66 expand at a lower portion of the front portion 30 to form the terminal portion 26 of the socket adapter 10.

As shown in FIGS. 1–3, a pair of apertures 78 are formed in the terminal portion 26 and are alignable with the elongated cylindrical members 54 in the back portion 32. The aperture 78 and the elongated pair of cylindrical members 54 are designed to receive barrel locks to releasably mount a terminal cover on the front and back portions or plates 30 and 32, as described hereafter.

A plurality of dividers 80 are arranged in parallel with the side flanges 64 and 66 in the terminal portion 26 of the front portion 30. The dividers 80 are joined to a generally horizontally extending wall 82 which extends between the side flanges 64 and 66. A second wall 84 also extends between the side flanges 64 and 66 and is spaced from the first wall 82. The dividers 80 and the spaced walls 82 and 84 form a plurality of cavities 88, shown in FIGS. 1–3, in which are mounted hollow cylindrical posts 86 which open to the interior of each cavity 88. Open apertures or slots 90 are formed in the second wall 84, one for each of the cylindrical posts 86. The slots 90 open to the cavity 88 behind each cylindrical post 86. As shown in the rear view of the front plate 30 in FIG. 4, small, angled flanges 92 are formed on each divider 80 adjacent each cavity 88 to form mounting surfaces for receiving a terminal, as described hereafter, in each cavity 88. As is conventional, the terminals, shown in FIG. 11 and described in greater detail hereafter, receive a power line conductor or building load conductor through the slot 90 in the wall 84. A fastener associated with each terminal is open through each cylindrical post 86 to allow the line or load conductor to be secured joined to each terminal.

Figure 8:
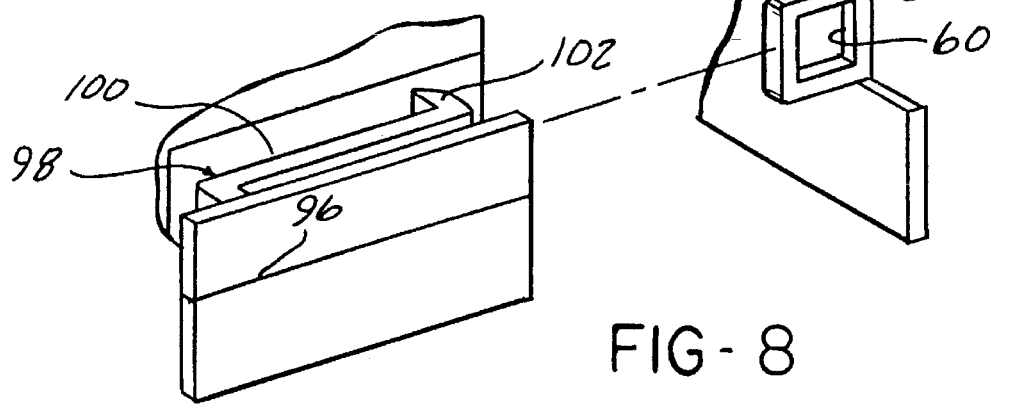
FIG. 8 is a partial, exploded perspective view of the joining means used to connect the first and second plates shown in FIG. 3.

A pair of opposed recesses 96 are formed on opposite sides of the side flanges 64 and 66. The recesses 96 receive a suitable joining means, such as a clip 98 therein, as shown in greater detail in FIGS. 3 and 8. Each clip 98 has a pair of spaced legs, one leg 100 of which terminates in an outwardly extending tapered flange 102. Each clip 98 is oriented in the recess 96 such that the flange 102 is oriented toward the back plate 32 and snaps into and engages the aperture 60 in the flange 58 in the base 34 of the back plate 32 as the front and back plates 30 and 32 are forced together. The insertion of a pointed tool, such as a screwdriver, from the back surface of the base 34 of the back portion 32 will separate the flange 102 from the aperture 60 in the flange 58 to release the clip 98 from the flange 58 and enable the front and back portions 30 and 32 to be separated.

It should be noted that each of the cylindrical posts 86 is aligned with one of the terminal paths 56 on the base 34 of the back plate 32 when the front and back portions 30 and 32 are joined together.

A second set of terminal posts 104 on the back portion 32 and the cylindrical post 106 on the front portions 30 are provided for receiving terminal connections for utility line potential.

As noted above, the annular side wall 36 on the back portion 32 is provided with an angular discontinuity 38 adjacent the lower portion thereof as shown in FIG. 3. Accordingly, the front portion 30 is provided with a rim filler denoted generally by reference number 110. The rim filler 110 includes a first annular flange 112 which is integrally formed with the base 62 of the front portion 30 adjacent a lower angular portion thereof. The outer ends of the flange 112 are adapted to slidably engage the ends 114 of the annular side wall 36 of the back portion 32.

Figure 6:
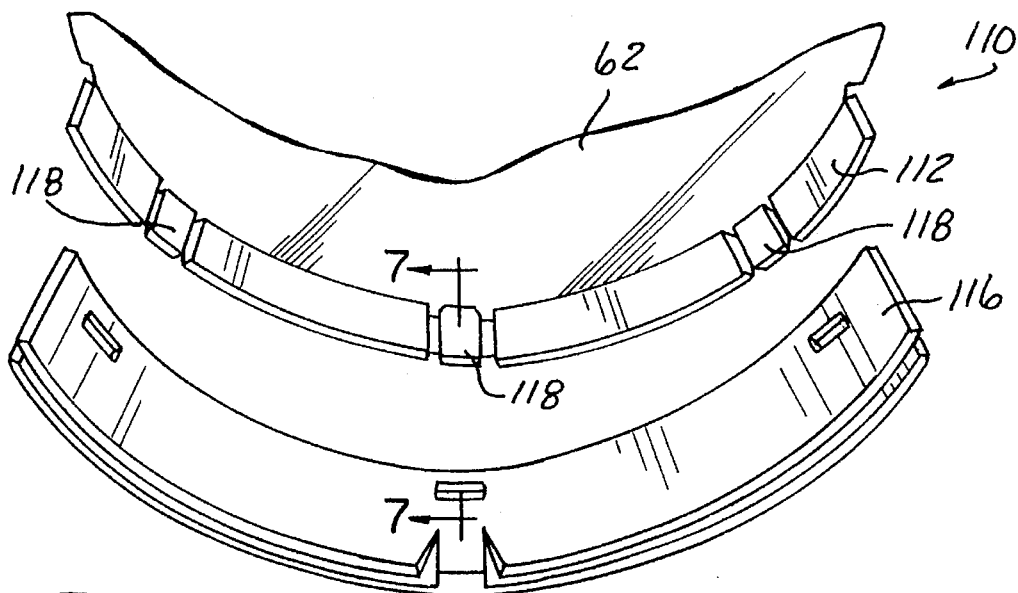
FIG. 6 is a partial, exploded, perspective view of the rim discontinuity filler shown generally in FIGS. 1, 2 and 3.
Figure 7:
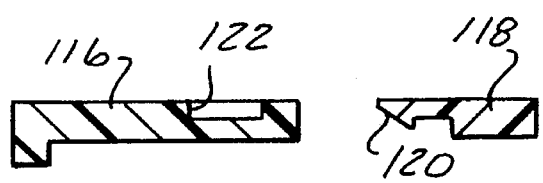
FIG. 7 is a cross sectional view generally taken along line 7—7 in FIG. 6.

The rim filler 110 also includes a separable rim filler extension 116 which has the same shape and size as the rim flange 112 and is designed to be releasably engaged with the rim flange 112. Means are provided for releasably joining the rim filler extension 116 to the rim flange 112. A plurality of tabs 118 are spaced along the rim flange 112, as shown in FIG. 6, and each include an outer projection 120 as shown in FIG. 7. The projections 120 engage recesses 122 formed in the rim filler extension 116 to releasably lock the rim filler extension 116 to the rim flange 112. Upward force on the tabs 120 will release the tabs 120 from the recesses 122 to enable the rim extension 116 to be separated from the rim flange 112. As shown in FIG. 1, when the rim filler extension 116 is joined to the rim flange 112, both the rim flange 112 and the rim filler extension 116 completely fill the discontinuity in the annular side wall 36 of the back portion 32 and complete the circumferential extent of the annular mounting flange 40 on the back portion 32 which releasably receives the mounting flange 16 on the watthour meter 12 and the sealing ring 20, as shown in FIG. 1 and described above.

Figure 9:
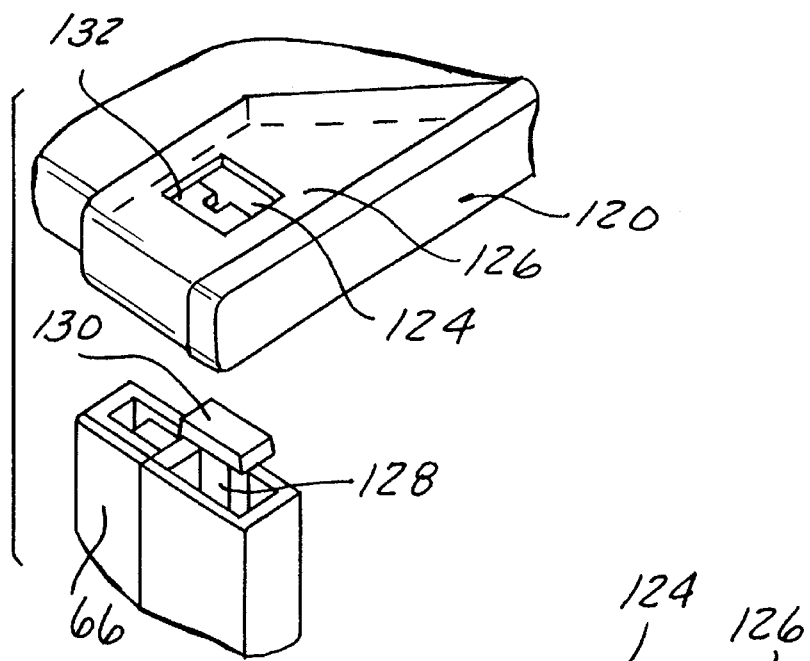
FIG. 9 is a partial, enlarged, exploded, perspective view of the terminal cover and terminal cover attachment means.
Figure 10:
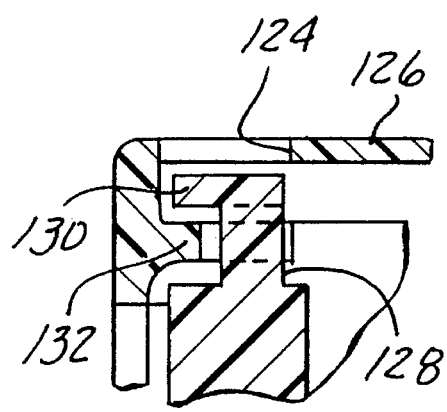
FIG. 10 is a cross sectional view of FIG. 9.
Figure 16:
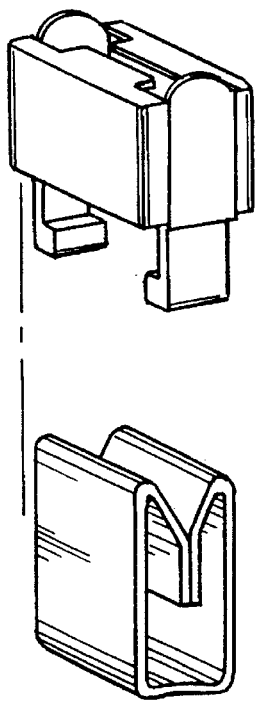
FIG. 16 is an exploded, perspective view of a prior art watthour meter mounting apparatus jaw clip.

As shown in FIG. 1, and in greater detail in FIGS. 3, 9 and 10, a terminal cover 120 is releasably mountable over the cylindrical posts 86 mounted on the front plate 30 to prevent access to the line and load terminal connections contained therein. The terminal cover 120 is in the form of a planar member having a peripheral flange. A pair of upstanding, spaced ears 122 are formed on the upper portion of the terminal cover and cover the aperture 72 in the front plate 30 after the fasteners have been inserted through the aperture 72 into the cylindrical posts 52 in the back portion 32 to mount the adapter to the building or support surface. An aperture 124 is formed in the front wall 126 of the terminal cover 120 adjacent one side edge thereof. A pin 128 is mounted on and extends outward from the lower portion of the front plate 32 and terminates in a laterally extending arm 130 which extends over the peripheral surface of the pin 128.

In use, the terminal cover 120 is oriented at an angle with respect to the terminal portion 26 of the front portion 30 to enable the pin 128 and the arm 130 to be slidably inserted through the aperture 124 in the front wall 126 of the terminal cover 120. The opposite end of the terminal cover 120 is then lowered into engagement with the terminal portion 26 of the front portion 30. A short tab 132 is integrally formed with the terminal cover 130 and extends inward from the outer side wall of the terminal cover 120 as shown in FIGS. 9 and 10. The tab 132 underlays a portion of the aperture 124 in the front wall 126 of the terminal cover 120 to close off any access to the interior of the terminal portion 26 of the front plate 30 behind the terminal cover 126 and thereby prevent the entry of water or debris into the interior of the terminal portion 26.

Means are provided for releasably locking the terminal cover 120 to the terminal portion 26 of the socket adapter 10. As shown in FIG. 1, at least one and preferably a pair of spaced cylindrical bosses 134 are formed on and extend outward from the front wall 126 of the terminal cover 120. The bosses 134 are aligned with the aperture 78 in the front portion 30 and the tubular members 54 in the back portion 32 which receive a conventional barrel lock therein. Other terminal cover locking means, such as a wire seal, may also be employed.

As shown in FIG. 5, when the front and back portions 30 and 32 are joined together as described above, an internal cavity 140 is formed between the facing surfaces of the base 34 of the back portion 32 and the annular base 62 of the front portion 30. The cavity 140 receives a plurality of electrical conductors which connect the terminals mounted in the terminal portion 26 with jaw terminals mounted in a plurality of receptacles 142 integrally formed on and extending from the base 62 of the front portion 30. The number and spacing of the receptacles 142 in the front portion 62 is selected to correspond to the number of jaw contacts required in the socket adapter 10. The number of receptacles 142 may vary depending upon whether the socket adapter 10 is designed for single phase, poly-phase or other watthour meter applications. Thus, the number of receptacles 142 shown in FIGS. 1–5 is to be considered as exemplary only.

Figure 12:
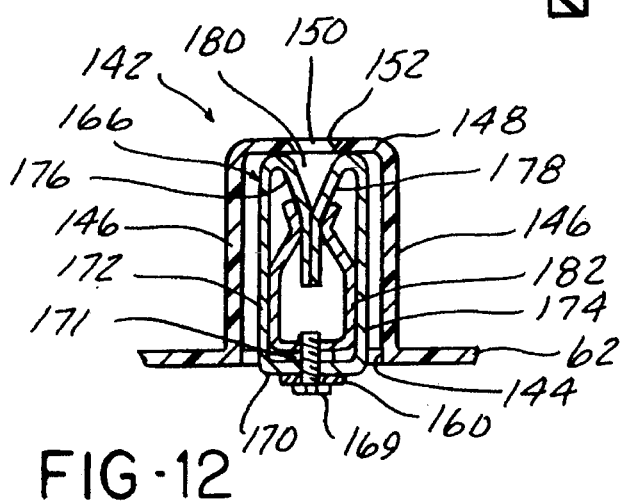
FIG. 12 is a cross sectional view generally taken along line 12—12 in FIG. 4.

As shown more clearly in FIG. 12, each receptacle 142 is integrally formed with the base 62 of the front portion 30 and extends outward from one surface of the base 62, away from the back portion 32. Each receptacle 142 is formed with an open end 144 which is disposed in communication with and opens to the interior cavity 140 formed between the front and back portions 30 and 32, respectively. Each receptacle 142 also includes four side walls generally denoted by reference number 146 and an upper or outer end wall 148 joined to the side walls 146 and opposed from the open end 144. An aperture 150 is formed in the outer wall 148 of each receptacle 142. At least two and preferably all four sides of the aperture 150 which is typically in the form of an elongated slot are formed with inwardly angled or tapering edges 152 as shown in FIG. 12. The tapering edges 152 act to guide the blade terminal 18 of a watthour meter 12 through the aperture 150 and into engagement with a jaw contact denoted generally by reference number 166 which is loosely and removably disposed within the interior of the receptacle 142.

Each receptacle 142 is sized to receive at least one jaw contact. As shown by way of example only, in FIG. 2, one of the receptacles denoted by reference number 154 is provided with an elongated, generally rectangular shape with two slots 150 formed therein. This receptacle 154 receives two jaw contacts in a side-by-side arrangement with an internal wall integrally formed with the side walls of the receptacle 154 disposed therebetween.

Figure 4:
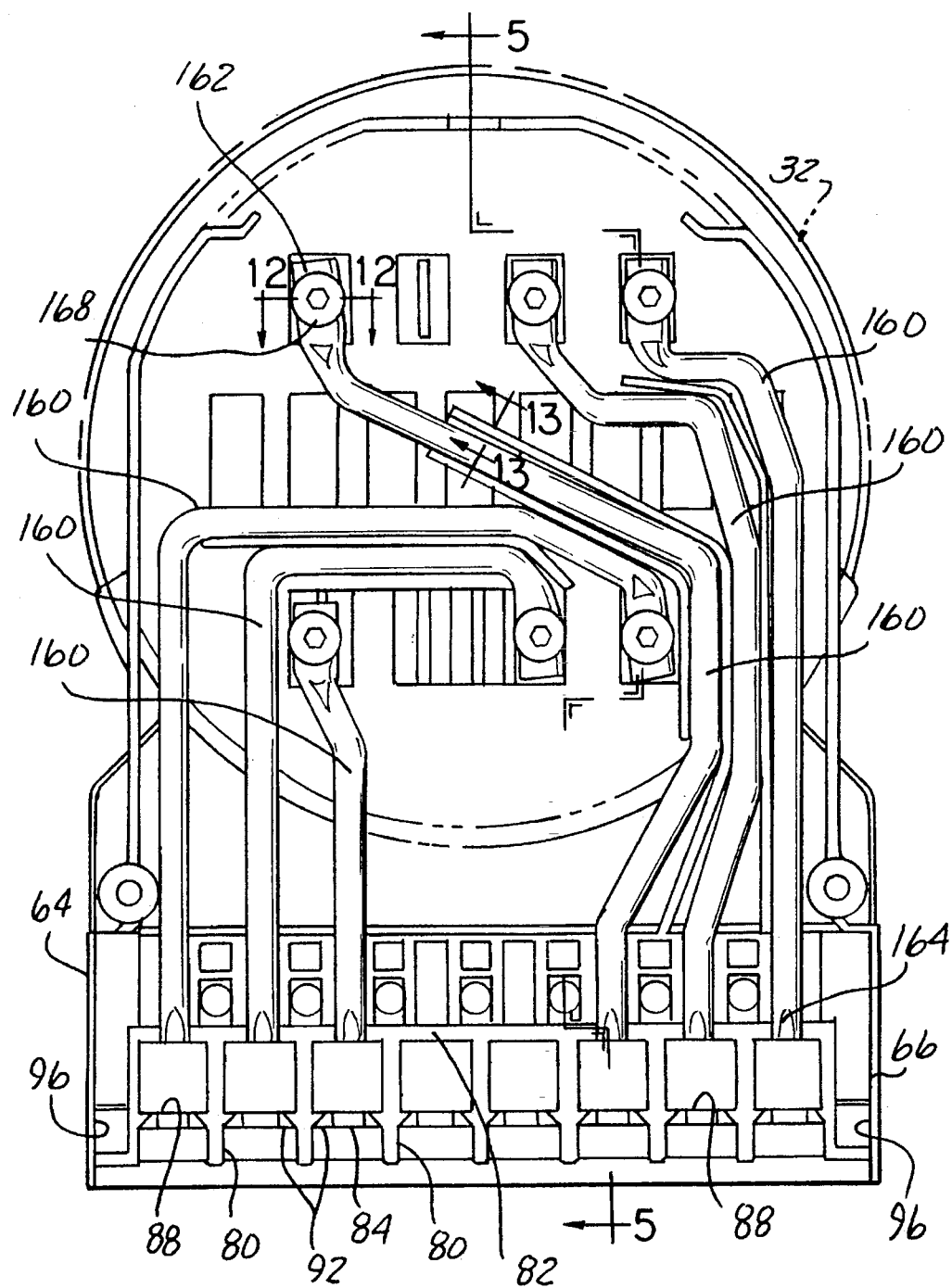
FIG. 4 is a rear view of the first plate shown in FIG. 3.
Figure 11:
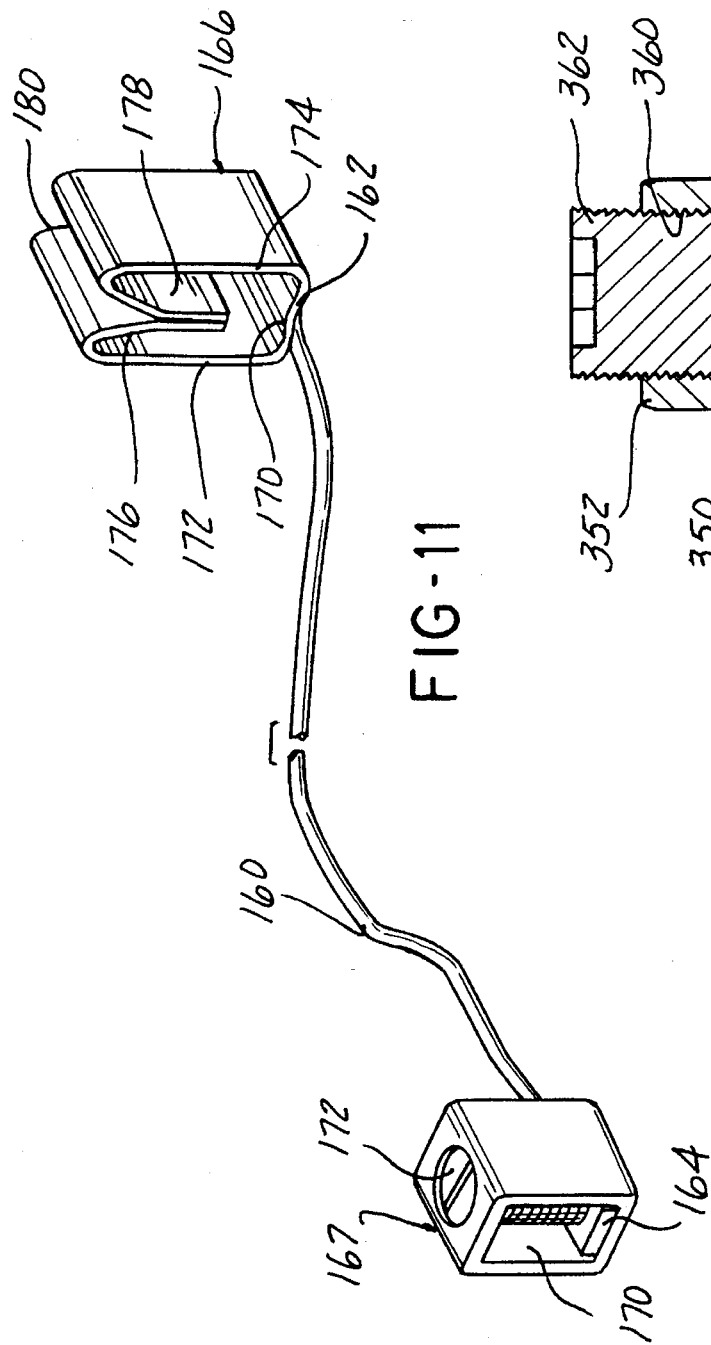
FIG. 11 is a perspective view of one of the electrical conductors employed in the apparatus shown in FIG. 1 and including a jaw contact and a line/load terminal.

As shown in FIGS. 2 and 4, and in greater detail in FIGS. 11 and 12, a plurality of electrical conductors 160, with six being shown in an exemplary embodiment, are mounted in the hollow cavity 140 formed between the base 62 of the front portion 30 and the base 34 of the back portion 32. Each of the conductors 160 is identically constructed, except for variations in length and angular arrangement. The length and angular arrangement of the conductors 160 places the conductors 160 in a common, single plane in the cavity 140 between the front and back portions 30 and 32, with each conductor 160 spaced from adjoining conductors as shown in FIGS. 2 and 4. Each conductor 160 is preferably formed of a solid, tubular member formed of an electrically conductive material, such as copper. Each conductor 160 has first and second opposed ends 162 and 164 which are flattened so as to be engagable with a jaw contact 166 at a first end 162 and a terminal 167 at the second end 164. The first and second ends 162 and 164 of each conductor 160 are joined to a jaw contact 166 and a terminal 167 by suitable means, such as by means of fasteners, i.e., screws 168, as shown in FIG. 4 or by other means, such as soldering, bolts and nuts, etc.

As shown in FIG. 11, the terminal 167 is conventionally constructed as a four-sided cubical member with an internal bore 170 extending therethrough. The second end 164 of a conductor 160 is inserted into the bore 170 in the terminal 167 and secured to the terminal 167 by means of a threaded screw 172. The threaded screw 172 extends through the wall of the terminal 167 and enables an external electrical conductor, not shown, such as a power line conductor or a building load conductor, to be inserted into the bore 170 in the terminal 167 and electrically connected to the second end 164 of the electrical conductor 160 by means of the screw 172.

The first end 162 of each conductor 160 is fixedly connected to a jaw contact 166 as described above. By way of example only, and as shown in FIGS. 11 and 12, each jaw contact 166 has a conventional shape formed of a base 170, a pair of spaced side walls 172 and 174 extending from the base 170, and a pair of inwardly extending legs 176 and 178 which form continuous extensions of the side walls 172 and 174, respectively. The inwardly extending legs 176 and 178 form an expandable opening 180 therebetween which is aligned with the aperture 150 in a receptacle 142 on the front portion 30 for receiving the blade terminal 18 of a watthour meter 12 therein in a snap-in fit. A spring retainer element 182 is mounted interiorly within each jaw contact 166 for biasing the ends of the inwardly extending legs 176 and 178 together to insure a solid electrical connection between the jaw contact 166 and the mating blade terminal 18 of a watthour meter 12 shown in FIG. 1.

A threaded bolt 169 extends through aligned apertures in the first end 162 of the conductor 160, the base 170 of the jaw contact 166 and a nut 171 to retain such elements in a joined connection. The spring retainer element 18 is loosely held in position by the end bolt 169 through an aperture in the bottom of the spring retainer element 182.

Figure 13:
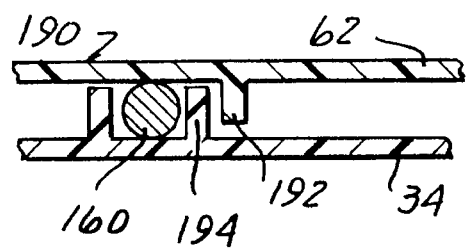
FIG. 13 is a cross sectional view generally taken along line 13—13 in FIG. 4 and showing the insulating barriers between two adjacent electrical conductors.

As shown in FIGS. 4 and 13, barrier means are provided between adjacent portions of the conductors 160 disposed in the cavity 140 between the front and back portions 30 and 32, respectively. The barrier means preferably is in the form of at least one divider member integrally formed with and extending from the base 62 of the front portion 30 or the base 34 of the back portion 32. In a preferred embodiment, as shown in FIG. 13, the barrier means 190 preferably comprises two divider members 192 and 194. One divider member 192 is integrally formed on and extends outward from the base 62 of the front portion 30. The corresponding divider member 194 is integrally formed on and extends outward from the base 34 of the back portion 32. When the front and back portions 30 and 32 are joined together, the divider members 192 and 194 are disposed in close proximity to each other. The divider members 192 and 194 may be disposed in registry. However, all that is necessary is that the divider members 192 and 194 be in close proximity with each other. Such an arrangement forms an elongated path between a conductor 160 located adjacent to the divider member 194 and another conductor, not shown, located adjacent to the opposite divider member 192. This provides the requisite flash distance required by electrical industry standards. The use of the barrier means 190 also enables the electrical conductors 160 to be bare or without exterior insulation. This further reduces the cost of constructing the apparatus of the present invention.

In assembling the socket adapter 10, the plurality of electrical conductors 160, each having a jaw contact 166 and a terminal 167 mounted at opposite ends, are inserted into the back of the base 62 of the front portion 30, with one of the jaw contacts 166 being loosely disposed in one of the receptacles 144 in the base 62 and the terminal 167 mounted in one of the cavities 88 in the terminal portion of the front portion 30. The front portion 30 is then joined to the back portion 32, with the clips 98 engaging the mating aperture 60 and the flanges 58 on the base 34 of the back portion 32. In this arrangement, the conductors 160 and the attached jaw contacts 166 and terminal 167 are housed within the cavity 140 formed between the front and back portions 30 and 32, respectively, without the need for additional fasteners previously employed in socket adapters to fixedly mount the jaw contacts and the terminal blocks to the back plate or base of the socket adapter housing. At the same time, the base 62 and the receptacles 142 on the front portion 30 cooperate to form a shield with the adjoining walls of the back portion 32 and the annular side wall 36 of the back portion 32 to completely surround substantially all of the exposed portions of the jaw contacts 166, except for the narrow slot 150 in each receptacle 142 which allows a blade terminal of the watthour meter 12 to be inserted into contact with the jaw contacts 166. This forms a shield completely around the jaw contacts 166 and the conductors 160 which prevents any inadvertent contact by the utility employee with such conductors and jaw contacts, which may be carrying potential, during installation or removal of a watthour meter 12 into and from the socket adapter 10. At the same time, the shield prevents any short circuits or faults between adjacent jaw contacts or conductors caused by a tool or screw accidentally contacting two contacts or by the meter blade terminals touching the line jaw contacts and the edge ground strip during installation of the meter which could create a spark and possibly damage the socket adapter 10 and/or injure any nearby utility personnel.

After the socket adapter 10 has been mounted on a suitable wall or other support surface at a building or residential site, the electrical utility power line conductors and the building distribution load conductors are attached to the appropriate terminals 167. The terminal cover 120 is then mounted on the terminal portion 26 of the front plate 30 and locked in place by conventional sealing means. The socket adapter 10 is then ready to receive a watthour meter 12 and a sealing ring 20 in a conventional manner. Alternately, the meter 12 can be mounted in the adapter 10 before the adapter 10 is mounted on a wall. Then, the conductors are connected to the terminals and the terminal cover mounted on the adapter 10.

Figure 14:
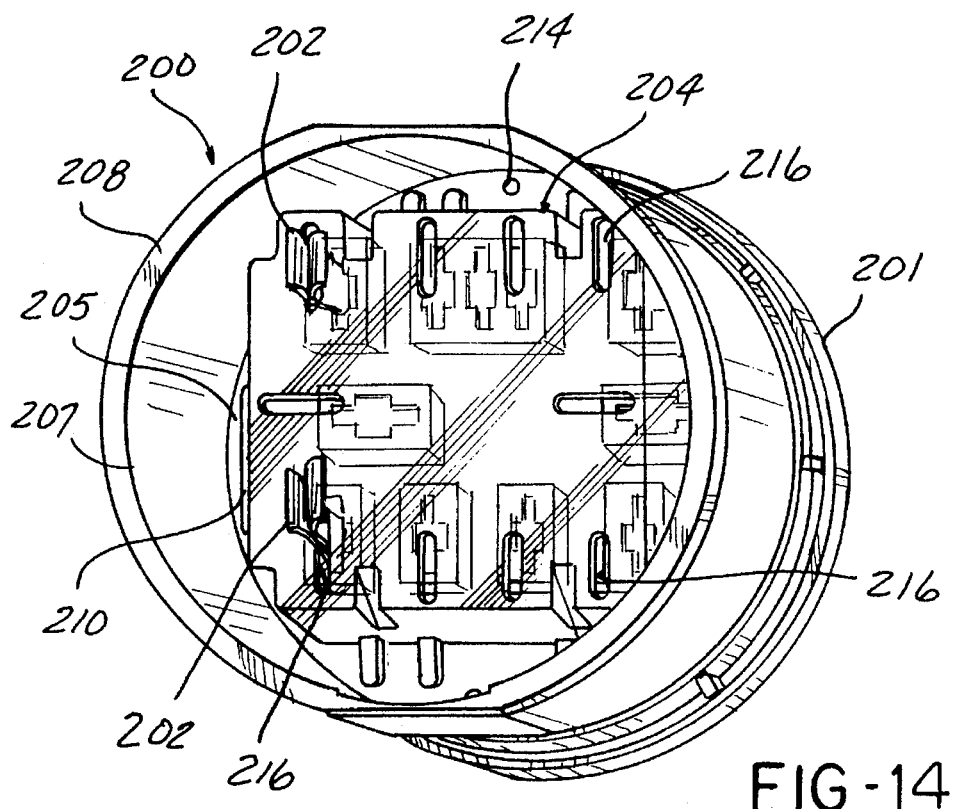
FIG. 14 is a perspective view of an electrical watthour meter mounting apparatus having a safety shield according to another embodiment of the present invention mounted therein.
Figure 26:
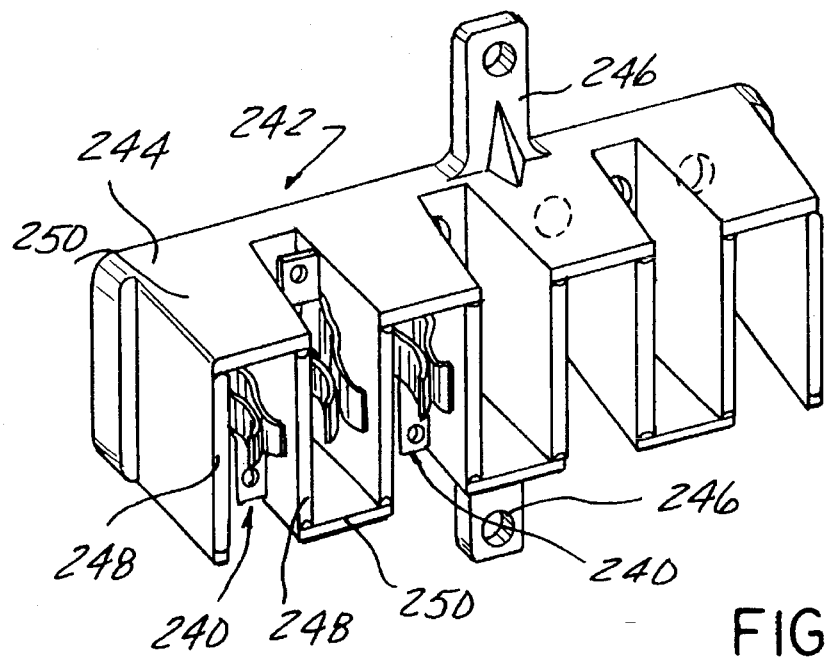
FIG. 26 is a perspective view of a potential terminal block mountable in the apparatus shown in FIG. 14.
Figure 27:
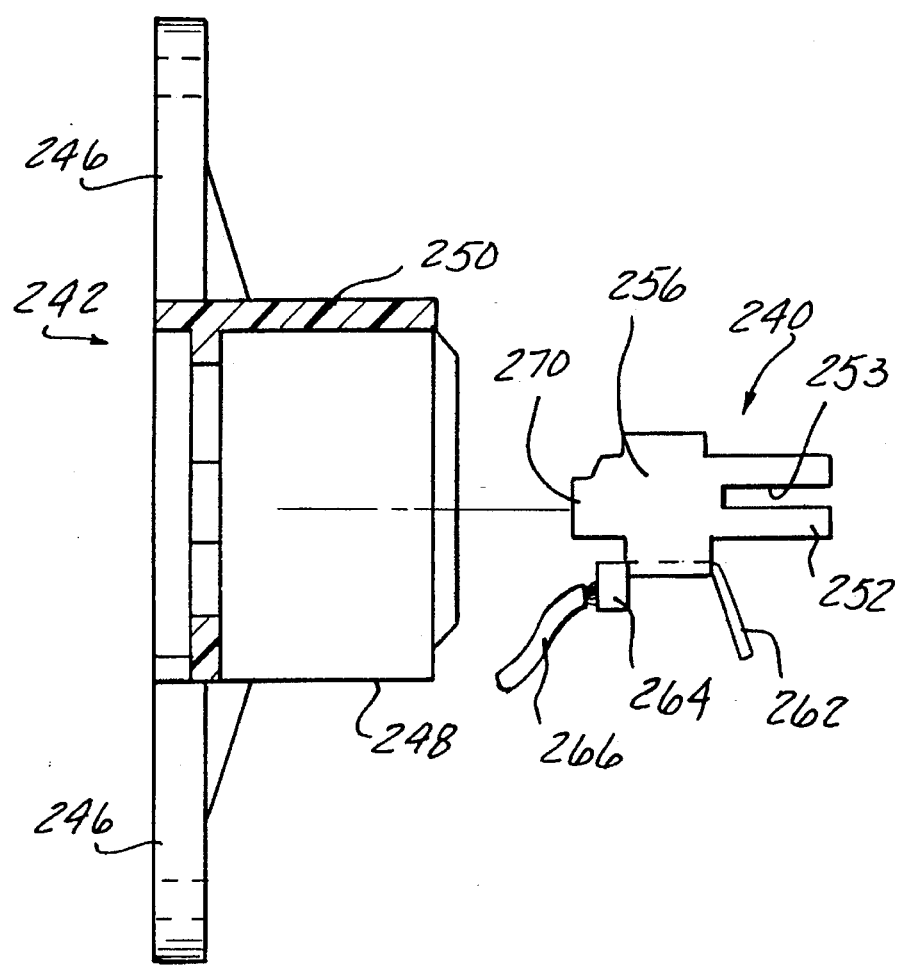
FIG. 27 is a exploded, side elevational view showing the mounting of a potential terminal in the terminal block shown in FIG. 26.
Figure 28:
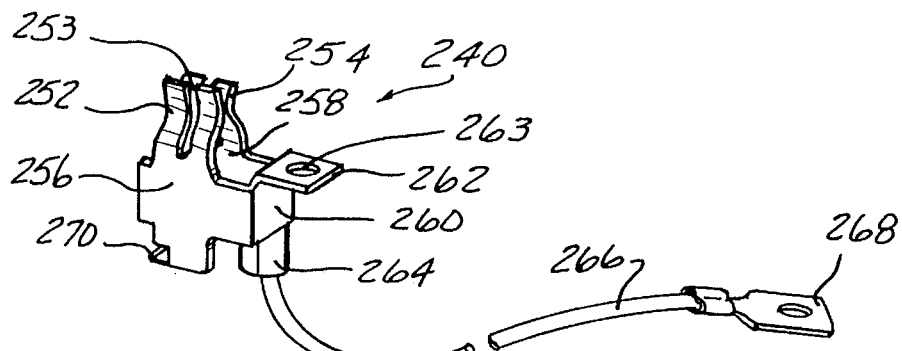
FIG. 28 is a perspective view of the conductor and terminal shown in FIG. 27.

Referring now to FIGS. 26, 27 and 28, there is depicted potential terminals 240 and a potential terminal block 242 which may be employed in the embodiment of the present invention shown in FIG. 14 to mount the potential terminals 240 in the adapter 10. The terminal block comprises a housing 244 formed of an electrically insulating material and has a pair of outwardly extending flanges 246 which receive suitable fasteners to mount the housing 244 to the bottom of the socket extender 200. The housing 244 is formed with a plurality of spaced dividers 248 which are alternately connected on opposite ends by end walls 250. The dividers 248 and end walls 250 form a series of co-linear slots in each of which a potential terminal 240 is mounted in a snap-in connection.

Instead of the separate terminal block 242, the housing 244 with the dividers 248 and end walls 250 may be integrally formed or molded as part of the base 205 of the adapter 200 shown in FIG. 14.

As shown in greater detail in FIGS. 27 and 28, each potential terminal 240 includes a pair of spaced jaw contacts 252 and 254 which are formed as extensions of a pair of spaced side walls 256 and 258, respectively. A slot 253 divides each contact 252 and 254 into two separate contact or jaw fingers. The contacts 252 and 254 are formed with sharp edges when stamped from a blank. This creates a self wiping action when a blade terminal, which has a width greater than the length of the contacts 252 and 254, is inserted into and removed from the contacts 252 and 254.

The side walls 256 and 258 are interconnected by an end wall 260 which has a perpendicular quick connect tab or flange 262 extending therefrom for receiving a fast-on connector. Optionally, an aperture 263 is formed in the tab 262 for receiving a self-tapping screw, not shown, to attach a conductor to the tab 262. A wire crimp collar 264 is integrally formed on the end wall 260 interiorly between the side walls 256 and 258 and is designed to be crimped around one end of a potential wire 266. The opposite end of the wire 266 has a conventional terminal 268 attached thereto to provide a connection to the potential terminals, not shown, in the terminal portion of the socket adapter 200.

Each terminal 240 is designed to snap into the housing 244 of the terminal block 242 by means of a pair of mounting tabs 270 extending from each of the side walls 256 and 258. The mounting tabs 270 snap into suitably designed aperture formed in the housing 244 to retain the terminal 240 in the housing 244.

In the embodiment shown in FIGS. 1, 2 and 3, a plurality of hollow receptacles 272 are formed on the first plate 62 of the housing. The receptacles 272 are similar to the receptacles 142 described above for the jaw contacts of the socket adapter, but are smaller in size so as to loosely receive one of the potential terminals 240 therein. Each receptacle 272 has a slot formed therein which is alignable with and opens to the jaw contact portions 252 and 254 of each potential terminal 240 to allow the insertion of a blade similar to, but smaller than blade 18 through the slot into contact with the jaw contacts 252 and 254 of each potential terminal 240. In this mounting arrangement, the potential lead 266 is disposed rearward of the plate 62 and is completely enclosed between the plate 62 and the plate 34 of the two housing portions of the socket adapter housing.

Figure 15:
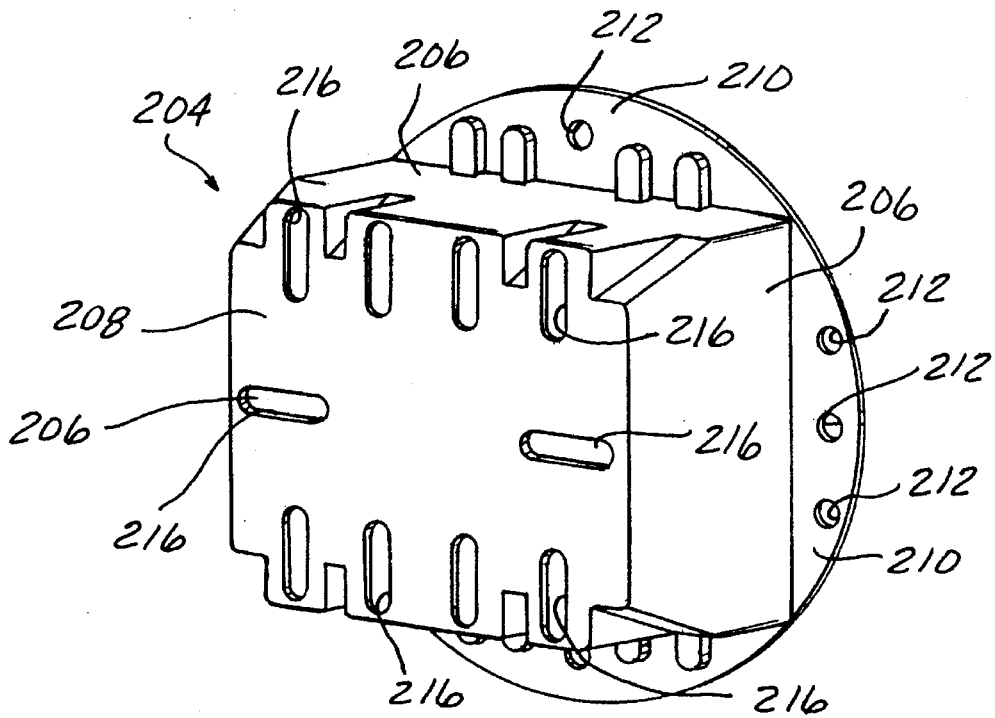
FIG. 15 is a perspective view of the flash shield shown in FIG. 14.

Referring now to FIGS. 14 and 15, there is depicted another embodiment of a safety shield for use with a watthour meter apparatus. A watthour meter socket extender 200 is depicted in FIG. 14 and includes a plurality of jaw contacts 202, only two of which are illustrated for purposes of clarity. It will be understood that the socket extender 200 shown in FIG. 14 is by way of example only as the safety shield to be described hereafter may be usable with other types of watthour meter apparatus, such as socket adapters, watthour meter sockets, etc.

According to this embodiment of the present invention, a safety shield denoted generally by reference number 204 is mounted within the socket extender 200 and in engagement with a bottom wall 205 of the socket extender 200. As shown in FIG. 14, the safety shield 204 is surrounded by the annular side wall 207 of the shell portion of the socket extender 200.

As shown more clearly in FIG. 15, the safety shield 204 is in the form of a housing formed with side walls 206 and a closed front wall 208. The back of the housing of the safety shield 204 is open. The safety shield 204 is preferably molded of a plastic material in a single piece housing with a single, large, hollow, interior cavity in which the jaw contacts 202 of the socket extender 200 are disposed when the safety shield 204 is mounted on the bottom wall 205 of the socket extender 200.

Mounting means in the form of a plurality of outwardly extending flanges 210, each having one or more apertures 212 formed therein, are integrally formed with the housing of the safety shield 204 and extend outward from an edge of some or all of the side walls 206 of the safety shield 204. The apertures 212 receive suitable fasteners, such as screws or plastic rivets 214, shown in FIG. 14, to securely mount the safety shield 204 on the bottom wall 205 of the socket extender 200.

A plurality of apertures, such as narrow slots 216, are formed in at least the front wall 208 of the housing of the safety shield 204. The number and location of the apertures 216 are selected to correspond to the number and location of the jaw contacts 202 in the socket extender 200. The apertures 216 may be provided only in the front wall, but may also extend a short distance into the adjoining side wall 206 as shown in FIG. 15.

When the safety shield 204 is mounted to the bottom wall 205 of the socket extender 200 by means of fasteners extending through the apertures 212 and the mounting flanges 210, the apertures or slots 216 will be aligned with the jaw contacts 202 in the socket extender 200 thereby providing a narrow opening which allows the insertion of the blade terminals 18 of a watthour meter 12 or other electrical apparatus, such as a socket adapter, through the apertures 216 and into contact with the jaw contacts 202. However, the safety shield 204 completely surrounds all of the remaining portions of the jaw contacts 202 in the socket extender 200 thereby providing safety and/or a flash shield which prevents any inadvertent contact with the jaw contacts 202 which may be carrying potential. In addition, the housing holds the jaw contacts 202 in place thereby eliminating the need for cotter pins.

Figure 18:
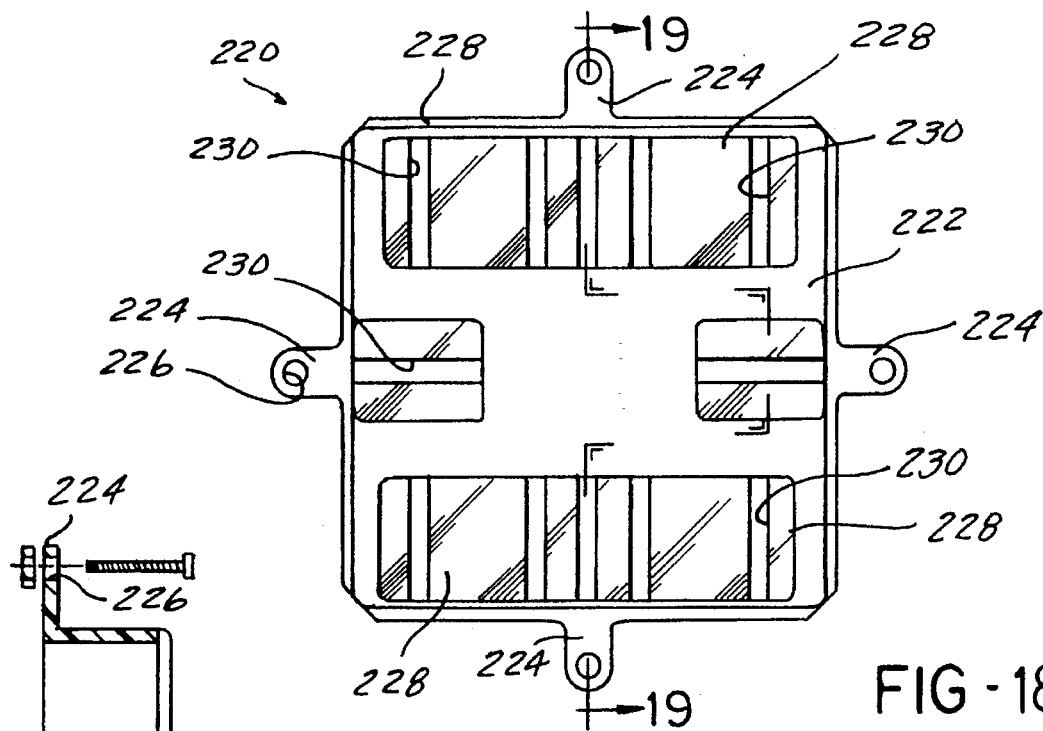
FIG. 18 is a plan view of another embodiment of a safety shield according to the present invention.
Figure 19:
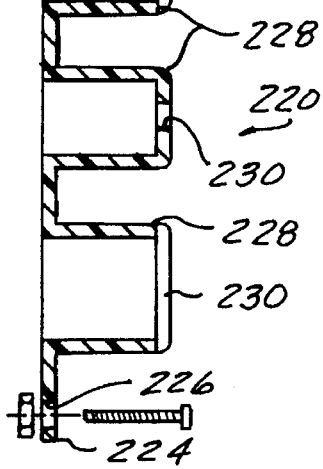
FIG. 19 is a cross sectional view generally taken along line 19—19 in FIG. 18.
Figure 17:
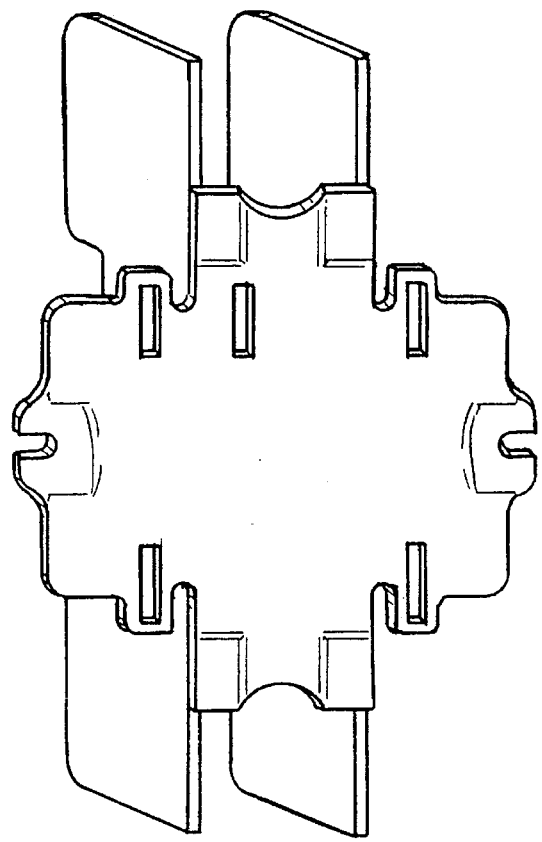
FIG. 17 is a perspective view of prior art watthour meter mounting apparatus safety shield.

Another embodiment of the safety shield of the present invention is shown in FIGS. 18 and 19. The safety shield 220 shown therein functions in the same manner as the safety shield 204 described above and shown in FIGS. 14 and 15 in that it is mountable in an electrical watthour meter apparatus, such as a socket extender 200, by means of fasteners extending through mounting flanges formed on the safety shield 220. However, the safety shield 220 shown in FIG. 18, instead of forming a single large hollow recess, includes a solid, planar wall 222 which is adapted to be disposed in registry or close proximity with the base 205 of a socket extender 200 or other electrical watthour meter apparatus. A plurality of mounting flanges 228, each having an aperture 226 therein, are integrally formed with and extend outward from at least two and preferably all four sides of the planar wall 222. A plurality of receptacles 226 are integrally formed in and extend outward from the planar wall 222. Each receptacle 228 is formed with adjoining side walls and an outer end wall and is sized to receive at least one or more adjacent disposed jaw contacts 202. Thus, each receptacle 228 completely surrounds one or more jaw contacts housed within the socket extender 200. A narrow slot 230 is formed in each receptacle 228 to allow for insertion of a blade terminal 18 of a watthour meter 12 or other electrical apparatus therethrough into connection with the jaw contacts 202.

The safety shield 220 described above could also be molded directly as a part of the bottom wall 205 of the shell portion of the socket extender 200 shown in FIG. 14. In this embodiment, the receptacles 228 shown in FIG. 19 would be formed as part of the bottom wall 205 of the shell portion shown in FIG. 14 and would extend outward from the bottom wall 205 of the shell portion. The receptacles 228 function in the same manner as the receptacles 142 and 272. As the socket extender 200 has a base 201 connected to the shell, the jaw contacts 202 would be loosely disposed in the receptacles 228 and the cavity between the shell and base 201 of the socket extender 200. This would eliminate the need for additional fasteners, such as cotter pins, to attach the jaw contacts 202 to the shell or base 201 as previously used in such socket extenders 200.

Referring now to FIGS. 20–25 and 33, 34 and 35, there is depicted another embodiment of the present invention. In this embodiment, reference number 310 depicts a polyphase A to S watthour meter socket adapter. The adapter 310 is formed of a two-part housing including a rear housing portion 312 and a front housing portion 314.

The rear housing portion 312 is formed with a planar base 316. An annular side wall 318 is integrally formed with and extends substantially perpendicularly from the base 316. The annular side wall 318 terminates in an angular discontinuity formed by side ends 320 and 322. Flanges 324 and 326 extend outward from the side ends 320 and 322, respectively, and are spaced therefrom to form mounting grooves for the rim filler described hereafter.

An annular rim 319 is formed at one edge of the annular side wall 318. An annular recess 321 may optionally be formed in the rim 319 for receiving a ground surge wire. Lower side walls 328 and 330 depend angularly from the side ends 320 and 322 of the side wall 318 to a bottom edge of the rear housing 312. A pair of hollow cylindrical members 332 are mounted integral with the lower side walls 328 and 330 to aid in aligning the front housing portion 314 to the rear housing portion 312.

In addition, a pair of spaced generally cylindrical members 334 and 336 of differing diameters are formed on the side of each of the lower side walls 328 and 330 and form alignment, support and interlock surfaces for the front housing portion 314 as described hereafter.

A plurality of spaced divider members all denoted generally by reference number 339 are formed on the base 316 and receive individual electrical conductors therebetween. The dividers 339 electrically insulate adjacent electrical conductors from each other in the same manner as described above for the dividers 194 and 196. Although the dividers 339 are depicted as being formed completely on the base 316 of the rear housing portion 312, it will be understood that the dividers 339 may take other forms, such as being integrally formed on a rear surface of the front housing portion 314 or as complimentary, mating members individually formed on the front and rear housing portions 312 and 314 in the manner described above and shown in FIG. 13.

Conductor terminal support surfaces 414 are formed in a lower portion of the base 316 for supporting electrical terminals thereon.

A metal hanger 410 is mounted on a rear surface of the base 316 for mounting the socket adapter 310 to a support surface in a conventional manner. A threaded boss 412 is formed on the base 420 for receiving a fastener to attach the hanger 410 through an aperture 460 formed in the rear housing portion 316 of the rear housing 312 as described hereafter.

The front housing portion 314 is formed as a one-piece, integrally molded member of an electrically insulating material, such as a suitable plastic. The front housing portion 314 can be formed of a transparent plastic to enable the location and connections of the conductors disposed behind the front housing portion 314 to be easily viewed. The front housing portion 314 includes a generally circular shaped, planar base 420. A plurality of hollow pockets or receptacles 422 are integrally formed on and extend outward from one surface of the base 420. As the receptacles 422 are identically formed and function in the same manner as the receptacles 142 described above in detail in the embodiment shown in FIGS. 1 and 2, the description of the shape, form and function of such receptacles 422 will not be described, except to note that each receptacle 422 is designed to mount a terminal attached to an electrical conductor therein and includes a slot for slidably receiving a blade terminal of a watthour meter or other electrical apparatus inserted into the adapter 310.

Figure 20:
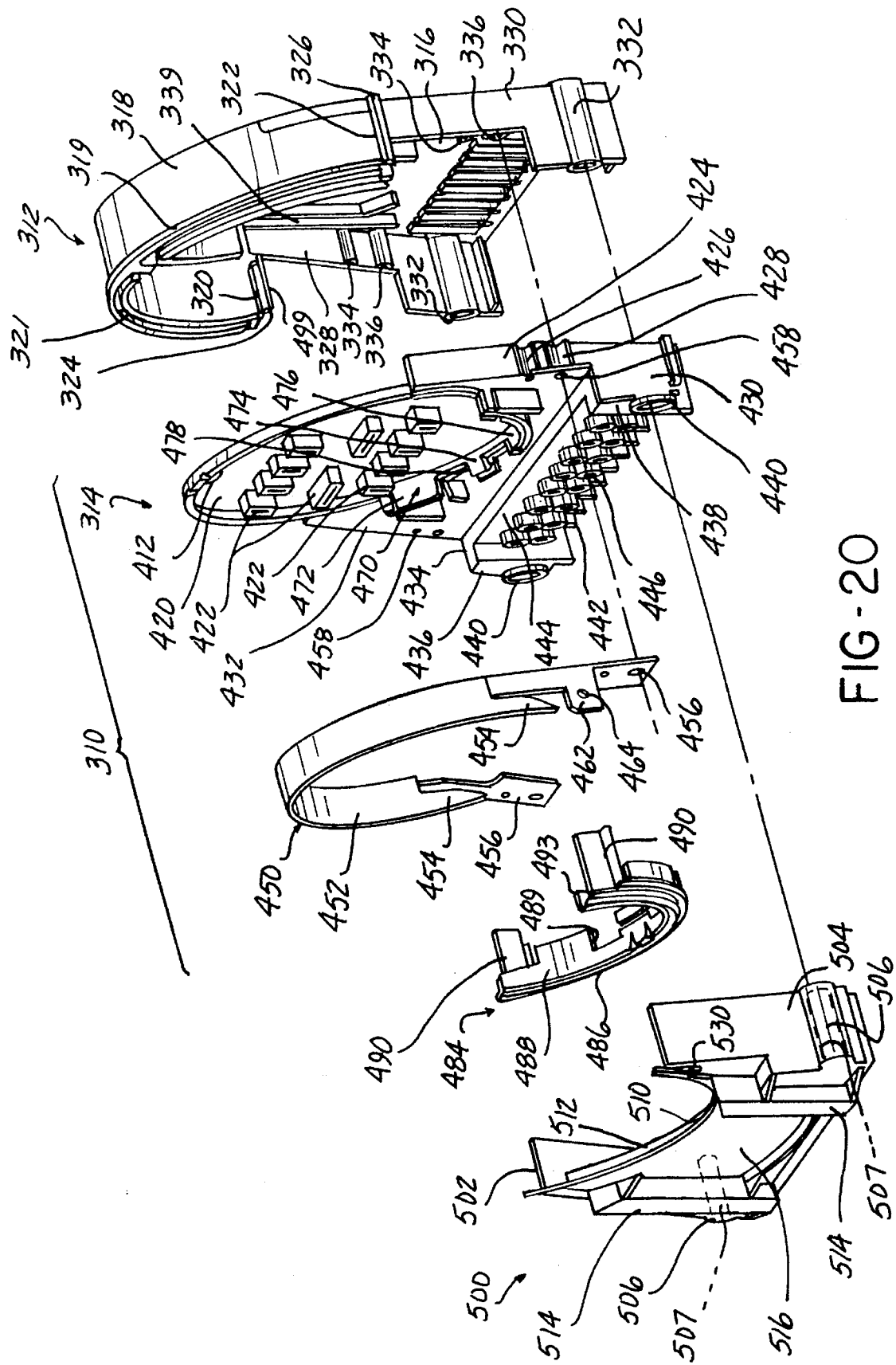
FIG. 20 is an exploded perspective view of another embodiment of a watthour meter mounting apparatus according to the present invention.

A pair of spaced mounting flanges 424, only one of which is shown in FIG. 20, extend from the base 420 of the front housing portion 314 and are engageable with the flanges 324 and 326 formed at the ends 320 and 322, respectively, of the side wall 318 of the rear housing portion 312. In this position, the mounting flanges 424 overlay a portion of the lower side walls 328 and 330 of the rear housing portion 312. A pair of arcuate, generally cylindrical recesses 426 and 428 are formed in each mounting flange 424 and are sized to matingly surround the cylindrical members 334 and 336 on the rear housing portion 312 to fixedly support and locate the front housing portion 314 to the rear housing portion 312 in a round dovetail like joint. A lower side wall 430 extends from the lowermost arcuate member 428 on each side of the first housing portion 314 to a bottom edge of the front housing portion 314.

A front cover filler 432 extends below the base 420 of the front housing portion 314 to a terminal block portion 434. The terminal block portion 434 extends outward from the front cover filler 432 and terminates in a pair of raised side walls 436 and 438 on opposite sides of the lower portion of the front housing portion 314. A pair of annular support members 440 are mounted in the side walls 436 and 438 and are alignable with the cylindrical bosses 332 in the rear housing portion 312 so as to receive mating and location pins 507 on terminal cover 500 as described hereafter.

A plurality of spaced dividers 442 extend outward from the terminal mounting base 444 and provide location for the terminals 350 also described hereafter. A plurality of aligned pairs of cylindrical, hollow tubular members 446 are mounted on the terminal mounting base 444 for providing access to the screw fasteners on the terminals mounted between the front and rear housing portions 314 and 312, as also described hereafter.

A surge ground conductor 450 is mountable over the base 420 of the front housing portion 314 and is disposed within the annular side wall 318 of the rear housing portion 312 after the front housing portion 314 has been joined to the rear housing portion 312. The surge ground conductor 450 includes an annular ring 452 which terminates at opposed ends in a pair of tapered fingers 454. Also, a pair of depending mounting flanges 456 extend from a rear edge of the annular ring 452 and include apertures which are alignable with corresponding apertures 458 on the front cover filler 432 for receiving fasteners to attach the surge ground conductor 450 to the front housing portion 314. One fastener extends through the uppermost aperture on each mounting flange 456 and one of the apertures 458 into the cylindrical member 334 in the rear housing portion 312 to secure the front and rear housing portions 314 and 312 together. Another fastener is extendable through each lower aperture in each mounting flange 456 and an aperture 458 in the front housing portion 314 and through the cylindrical member 336 to mount the socket adapter 310 to a wall or other support surface.

In addition, although not shown in FIG. 20, a depending apertured flange is centrally formed at an upper portion of the annular ring 452 and is alignable the threaded boss 412 in the top upper portion of the base 420 of the front housing portion 314.

Figure 33:
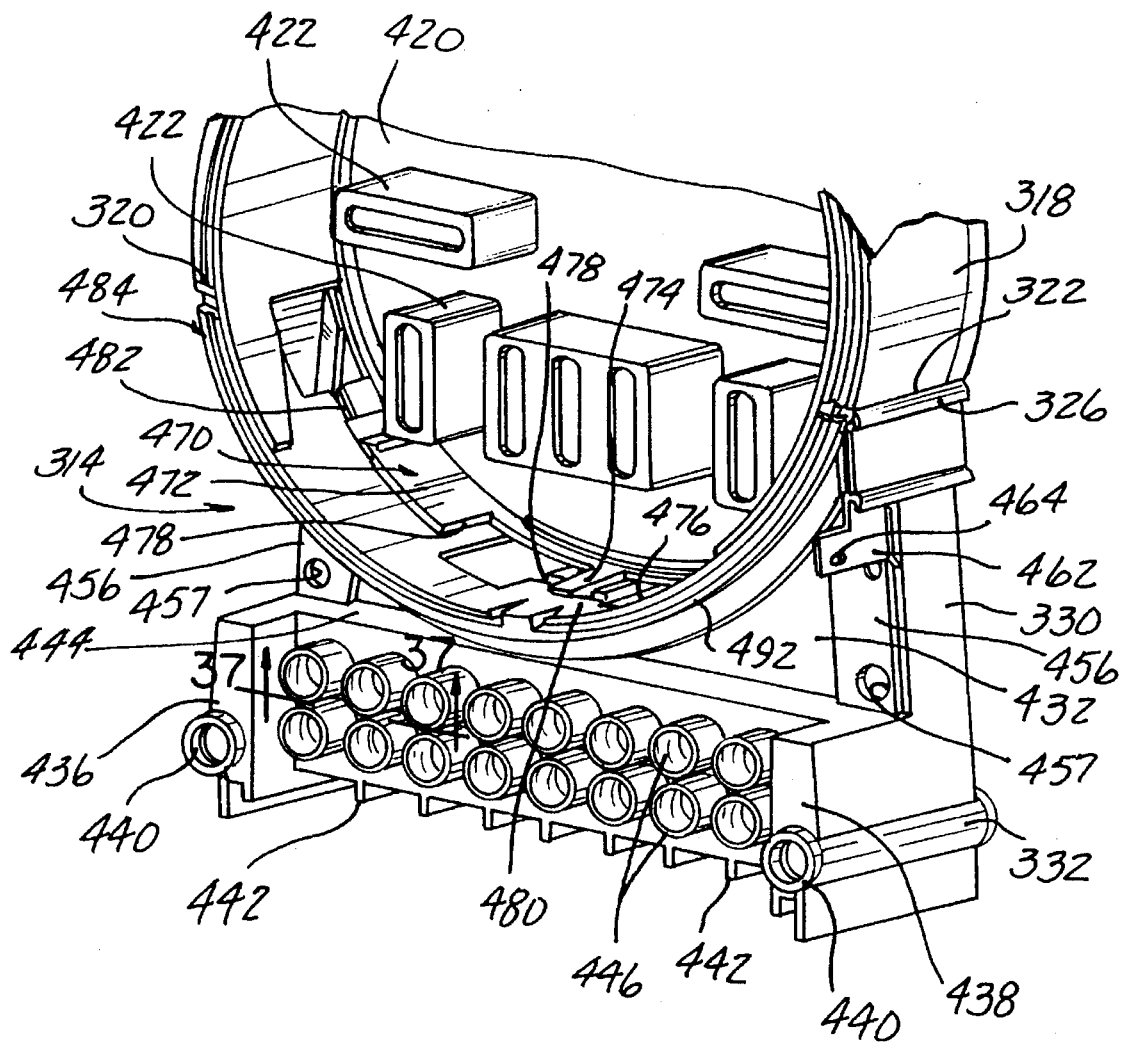
FIG. 33 is a perspective view of a lower portion of the assembled watthour meter mounting apparatus shown in FIG. 20.

As also shown in FIGS. 20 and 33, an outwardly extending flange 462 is formed on one depending flanges 456 of the surge ground conductor 450 and includes an aperture 464.

Figure 35:
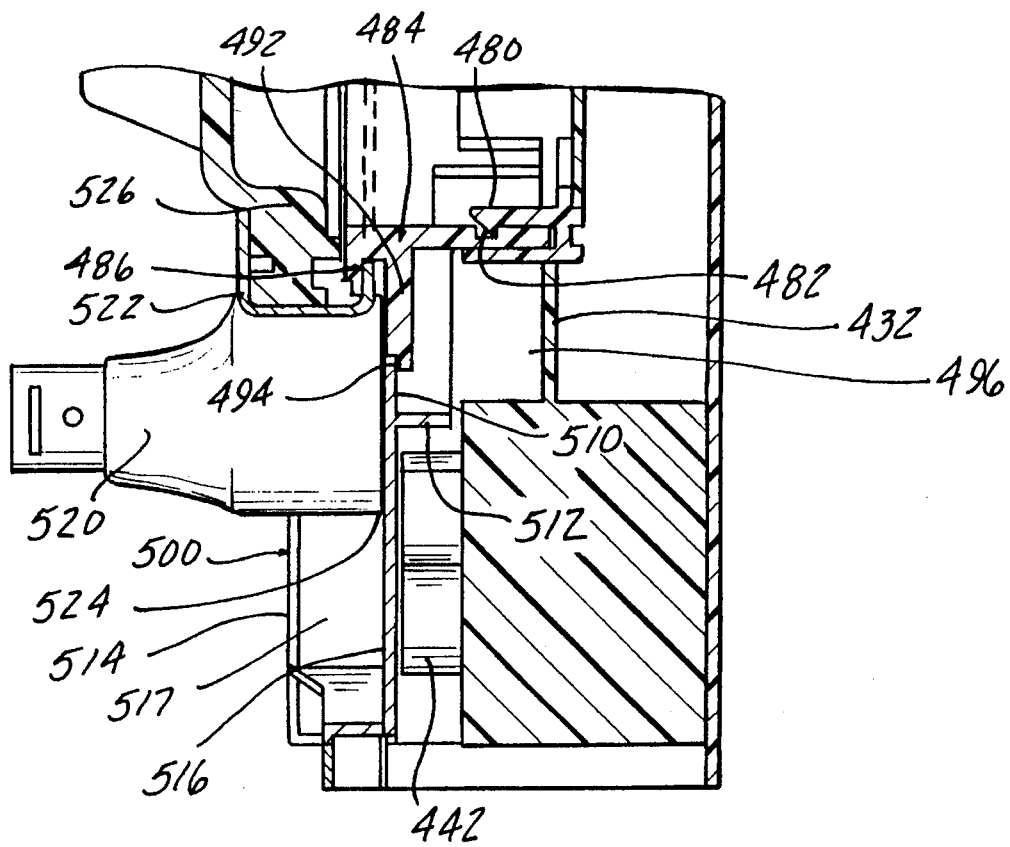
FIG. 35 is a cross sectional view generally taken along line 35—35 in FIG. 34.

As shown in FIG. 20, and in greater detail in FIGS. 33 and 35, a rim filler denoted generally by reference number 470 is formed on the base 420 of the front housing portion 314 and is positioned to fill the angular discontinuity between the side edges 320 and 322 of the annular side wall 318 of the rear housing portion 312 when the front housing portion 314 is mounted in the rear housing portion 312. The rim filler 470 extends substantially perpendicularly from a lower portion of the base 420 and includes a plurality of angularly spaced tabs 472, 474, and 476 which are angularly spaced apart to form open ended slots all denoted by reference number 478 therebetween.

Pointed tabs 480 are formed on the rim filler tabs 472, 474, and 476 to mate with corresponding slots 482 formed on a rim filler extension 484. As shown in FIGS. 20, 33 and 35, the rim filler extension 484 includes an arcuate portion 486 sized to fill the annular discontinuity in the annular side wall 318 of the rear housing portion 312. A plurality of inward extending, spaced tabs 488 are formed in the arcuate portion 486 and are spaced apart to form open ended slots 489 therebetween which align with the slots 478 in the rim filler 470 when the rim filler extension 484 is mounted on the rim filler 470 by means of the interlocking projections 480 and tabs 482. A pair of mounting arms 490 extend outward from opposite ends of the arcuate portion 486 and interlock with the flanges 324 and 326 of the rear housing portion 312 to align the rim filler extension 484 with the rear housing portion 312.

Figure 38:
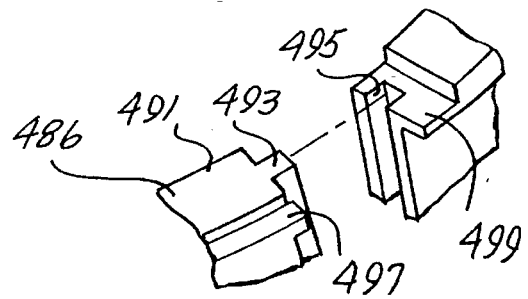
FIG. 38 is a partial perspective view of the interconnection of the rim filler and the rear housing portion shown in FIG. 20.

As shown in FIG. 38, the outer ends 491 of the arcuate portion 486 are formed with a narrow projection 493 which extends outward from each outer end 491. Each projection 493 slidably engage a mating slot 495 formed in each side end 320 and 322 of the annular side wall 318 of the rear housing portion 312. In addition, a ledge 497 on each end 491 of the rim filler extension 484 engages a similar ledge 499 on each side end 320 and 322 of the annular side wall 318 to limit insertion of the rim filler extension 484 into the annular side wall 318.

The slots 478 and 489 formed between the rim filler 470 and the rim filler extension 484 are disposed adjacent to the base 420 of the front housing portion 314 and provide openings through which auxiliary wires connected to electronic circuits in a watthour meter mounted in the socket adapter 310 or from current terminals or other terminals mounted in the socket adapter 310 to pass from the front housing portion 314 to the terminal portion, and from the terminal portion, as described hereafter, externally from the adapter 310.

As shown more clearly in FIG. 35, the rim filler extension 484 includes a peripheral flange 492 extending radially outward from the annular portion 486. The flange 492 has a recessed shoulder 494 formed at an outer peripheral edge thereof. When the rim filler extension 484 is attached to the rim filler 470, the peripheral flange 492 on the rim filler extension 484 is spaced from the front cover filler 432 to form an opening 496 therebetween for passage of the auxiliary wires extending from the front housing portion 314 through the openings formed between the slots 478 and 490 in the rim filler 470 and the rim filler extension 484.

Figure 34:
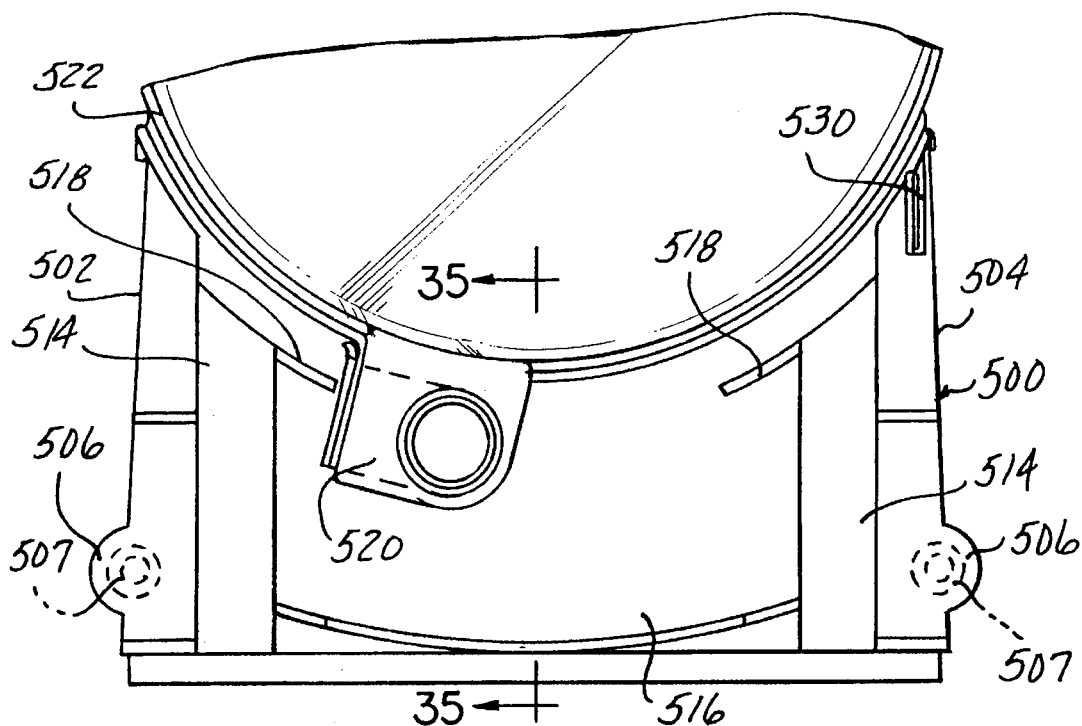
FIG. 34 is a front elevational view of a lower portion of the assembled watthour meter mounting apparatus shown in FIG. 20 with the terminal cover and a sealing ring and barrel lock mounted thereon.

A terminal cover denoted generally by reference number 500 in FIGS. 20, 34 and 35 is mountable over the terminal portion 444 of the front housing portion 314. The terminal cover 500 includes a front wall 516 and a pair of side walls 502 and 504. The side walls 502 and 504 slide over the lower side walls 328 and 330 of the rear housing portion 312. A cylindrical boss 506 is formed in each side wall 502 and 504 for surrounding alignment with one of the tubular members 332 formed in the side walls 328 and 330 of the rear housing portion 312. A pin 507 is mounted internally and concentrically within each boss 506. The pins 507 are typically hollow tubular members which taper toward the rear edge of the terminal cover 500. The pins 507 extend through the annular support members 440 and the cylindrical members 332 when the terminal cover 500 is mounted on the front housing portion 314 and are perpendicular to the surface of the front housing portion 314 to restrict partial removal of the terminal cover 500 from the front housing portion 314.

An arcuate edge formed on the front wall 516 extends between the side walls 502 and 504 and has an inward extending flange 512 extending therefrom. The edge 510 engages the shoulder 494 in the rim filler extension 484, as shown in FIG. 35.

A pair of raised channel sections 514 are integrally formed on the terminal cover 500 and extend outward from the front wall 516 of the terminal cover 500. Channel portions 514 are hollow and form an interior cavity 517 which opens to a cavity between the front wall 516 and the front cover filler 432 for the passage of the auxiliary wires through the terminal cover 500 in front of the terminals mounted behind the front housing portion 314. Ribs 518 may optionally be mounted on the front wall 516 of the terminal cover 500 and extend angularly from one end of each channel portion 514. The channel portions 514 and/or the optional ribs 518 function as stops to limit the amount of angular movement of a barrel lock 520 mounted on a sealing ring 522 used to lockingly mount a watthour meter in the socket adapter 310.

In this mounting position, as shown in FIGS. 34 and 35, the innermost surface 524 of the barrel lock 520 is located in close proximity with or even in registry with the front surface 516 of the terminal cover 500. This securely retains the terminal cover 500 on the front housing portion 314 after the barrel lock 520 and seal ring 522 has been mounted about the mating mounting flanges 526 of a watthour meter and corresponding mounting flange 486 formed on the rim filler extension 484. At the same time, the barrel lock 520 and seal ring 522 may only be rotated a limited angular amount before the barrel lock 520 contacts one of the channel portions 514 or the ribs 518 on the terminal cover 500. This prevents any excessive angular movement or rotation of the seal ring 522 in an unauthorized attempt to remove the sealing ring 522 or terminal cover 500 from the adapter 310.

In addition, a slot 530 is formed along one edge of the terminal cover 500 adjacent to the side wall 504 and is alignable with the outwardly extending flange 462 on the surge ground conductor 450. The aperture 464 in the flange 462 may be employed to receive a conventional wire seal, not shown, which extends through raised flanges formed on the seal ring 522 to lockingly attach the seal ring 522 to the adapter 310 and to provide an indication of any unauthorized tampering or attempted removal of the sealing ring 522 from the adapter 310.

Figure 36:
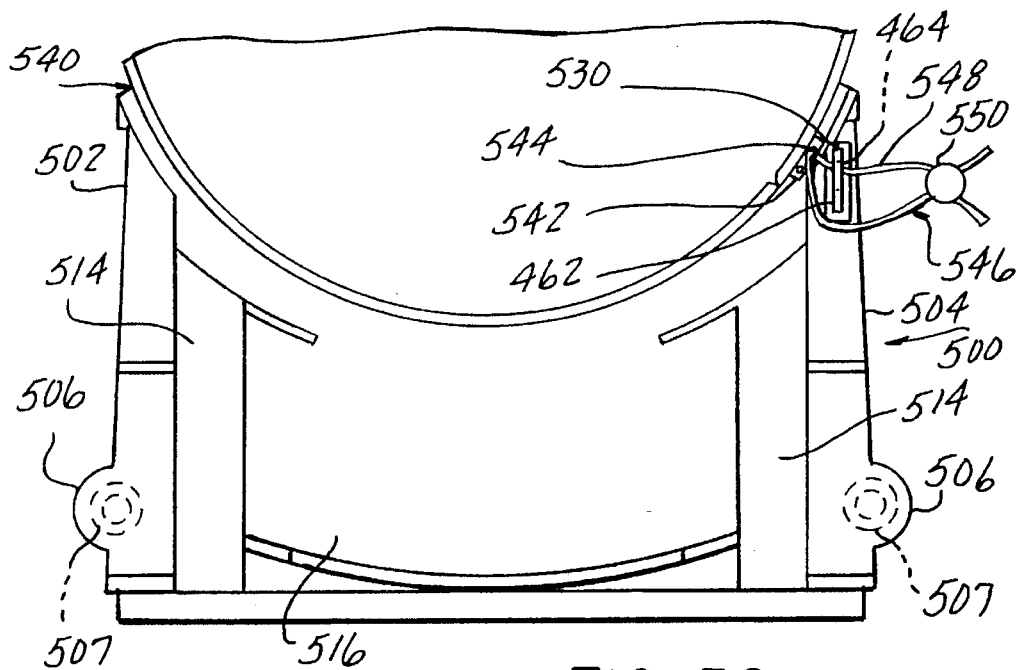
FIG. 36 is a front elevational view of a lower portion of the assembled watthour meter mounting apparatus shown in FIG. 20, with another type of sealing ring mounted thereon.

As shown in FIG. 36, a sealing ring 540 may also be mounted on mounting flange 486 and a mating mounting flange 526 of a watthour meter. The sealing ring 540 is of conventional construction and includes spaced ends which are brought into engagement when the sealing ring 540 is mounted on the mating mounting flanges. A flange 542 extending outward from one end of the sealing ring 540 passes through a slot in the other end of the sealing ring 540. At least one aperture 544 is formed in the flange 542. Due to the close proximity of the flange 462 on the surge ground conductor 450 with the rim filler extension 484, a conventional seal 546, such as a lead wire seal, may be used to sealingly connect the flange 462 and the flange 542 on the sealing ring 540 to provide an indication of any tampering or unauthorized removal of the sealing ring 540 from the adapter. A wire 548 is passed through the aperture 464 in the flange 462 on the surge ground conductor 450 and the aperture 544 in the flange 542 on the sealing ring 540 before the ends of the wire 548 are lockingly crimped into the lead slug 550.

This arrangement enables a single seal to be used with both the sealing ring 540 and the terminal cover 500 and eliminates the need for two separate seals, one for the sealing ring and one for the terminal cover.

When the front and rear housing portions 314 and 312 are joined together, the base 420 of the front housing portion 314, the base 316 of the rear housing portion 312, and the hollow receptacles 422 formed on the base 420 of the front housing portion 314 cooperate to form a safety shield which substantially, except for the slots in the receptacles 422, surrounds and encloses the conductors, the jaw contacts and the terminals in the adapter 310.

According to the present invention, a plurality of electrical conductors, all generally depicted by reference number 340 in FIGS. 21–23 and 25, are mounted in the adapter 310, between the base 420 of the front housing portion 314 and the base 316 of the rear housing portion 312. Although the conductors 340 are shown as being mounted in the adapter 310 shown in FIG. 21, it will be understood that such conductors 340 may also be employed in the first embodiment of the present invention shown in FIG. 1.

Figure 21:
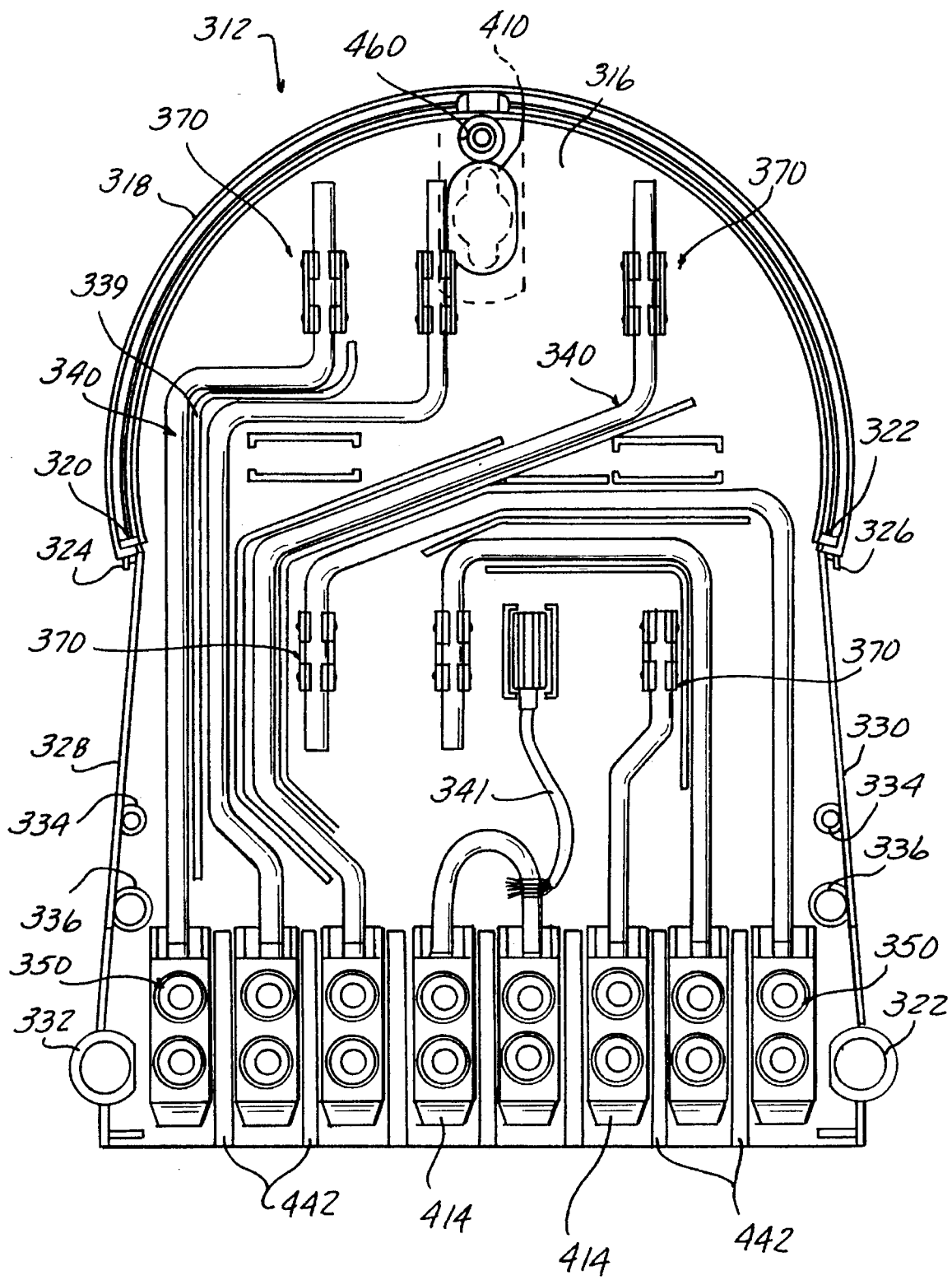
FIG. 21 is a front elevational view of the rear housing portion of the watthour meter mounting apparatus shown in FIG. 20 and illustrating the electrical conductors, terminals and contacts mounted therein.

Preferably, the conductors 340 comprise a rigid electrical conductor which is in the form of a bus bar. Generally, each conductor 340 has a polygonal cross section, i.e., rectangular, square, etc., with rectangular being preferred and depicted in FIGS. 21–23 and 32. Each conductor 340 is bent into predetermined angular sections, as shown in FIG. 21, so as to be spaced from adjacent conductors by a sufficient distance to prevent any flash or spark from passing therebetween. This eliminates the need for electrical insulation on the exterior of the bus bar-type electrical conductors 340. However, some such bus bar type conductors 340 can also be used in a conventional socket adapter, in certain applications without a flash shield, exterior insulation may be required.

However, it will be understood that an insulating barrier means 190 formed of one or more divider members 192 and 194, as described above and shown in FIG. 13, may also be formed on the base 316 and/or the base 420 and disposed between adjacent portions of the conductors 340.

The contacts 370 and terminals 350 are arranged in the adapter 310 in the conventional watthour meter adapter positions. As shown in FIG. 21, the topmost row of contacts 370 are in contact positions 1, 9 and 3, starting from the left edge in the orientation shown in FIG. 21. Contact position 8 between contact positions 9 and 3 is empty in this exemplary embodiment. The second or lower row of contacts 350 are mounted in positions 2, 10, 7 and 4, again starting from the left edge. The conductors 340 are formed so as to interconnect the various contacts to the terminals 350 in the standard terminal portions starting from the left end in FIG. 21. Thus, the contacts in positions 1, 9 and 3 are respectively connected to the first three terminals 350 starting from the left edge in FIG. 21. Another conductors 340 connect the contact in position number 2 to the leftmost or eighth terminal 350 and the contact in position number 4 to the sixth terminal 350 all in line from the left edge of the terminals in FIG. 21. The contact in position number 7 is connected by a small, non-bus bar conductor to a jumper bus-bar conductor 341 connected to the fourth and fifth terminals.

Each conductor 340 is arranged in the socket adapter 310 with its longest dimension oriented in alignment with the longest cross sectional dimension of the blade terminals 18 of a meter 12 when the meter 12 is inserted into the adapter 310. Each conductor 340 has first and second steps 346 and 348, respectively, which are formed by a reduced cross section or necked down first end portion 342 on each conductor 340.

Figure 32:
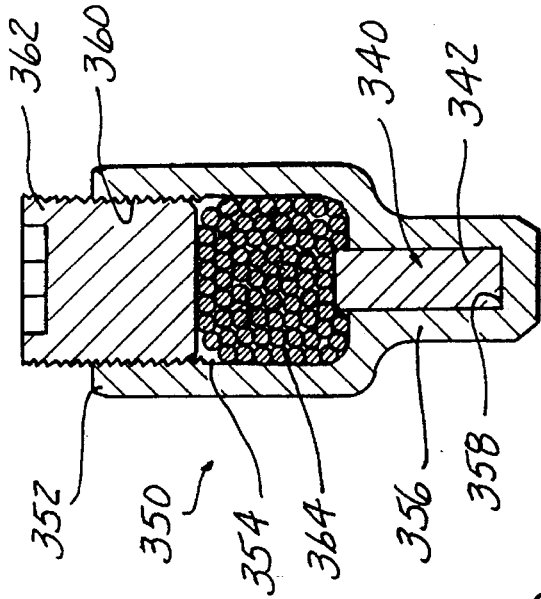
FIG. 32 is a cross sectional view generally taken along line 32—32 in FIG. 23.

A terminal 350 is slidably inserted over the first end 342 of each conductor 340. As shown in FIGS. 22, 23 and 32, each terminal 350 is in the form of an elongated, block-like collar having an upper portion 352 with a first through bore 354 extending therethrough. Each terminal or collar 350 also has a second lower portion 356 with a second bore 358 extending therethrough. The first and second bores 354 and 358 are open in communication with each other.

At least one and preferably a pair of threaded apertures 360 are formed in and extend through the upper portion 354 of the terminal 350 into communication with the first bore 354. Suitable fasteners 362, such as screws, are threaded through the apertures 360 into engagement with one end of a external electrical conductor 364 which is one of the electrical line or load conductors connected to the bottom-type adapter 310. The fasteners 362 fixedly connect the external conductor 364 to the terminal 350 and the electrical conductor 340 attached thereto. The use of two fasteners 362 provides increased contact force over a greater length between the conductors 364 and 340 to compensate for the narrow width of the conductor 340. Since the narrow thickness of the bus bar type conductors 340 contacts the conductor 364, the longer connection length between the conductors 340 and 364 and the use of two fasteners 362 provides sufficient contact surface area for increased current carrying capability. In addition, the top edge of each conductor 340 extends above the bottom of the upper portion 352 a short distance, such as 0,015 inches, to provide increased pressure on the conductor 340.

As shown in FIG. 23, the first step 346 formed in the first end 342 of the electrical conductor 340 acts as a stop in that when the electrical conductor 340 is mounted in the terminal 350, the first step 346 limits the length of insertion of the external electrical conductor 364 through and partially out from the first bore 354 in the terminal 350. Likewise, the second stop 348 abuts the end of the lower portion 356 of the terminal 350 and acts as a stop to limit the length of insertion of the first end 342 of the electrical conductor 340 into the terminal 350.

A jaw contact denoted generally by reference number 370 is fixedly mounted on the second end 344 of each conductor 340. The unique jaw contact 370 of the present invention is formed of first and second separate, contact clips 372 and 374 which are mounted on opposite sides of the major surfaces of the first end 344 of each conductor 340. As shown in FIGS. 24 and 25, each of the first and second contact clips 372 and 374 is formed with a first, generally planar, flat end portion 376 having at least one and preferably a plurality of apertures 378 formed therein. The apertures 378 are alignable with corresponding apertures formed in the first end 344 of each conductor 340.

A first intermediate portion 380 is formed on each contact clip, such as contact clip 374, and disposed at a predetermined angle from the end portion 376. The first intermediate portion 380 is bent out of the plane containing the flat end portion 376 generally at an angle of approximately 15° with respect to the plane containing the end portion 376. A second intermediate portion 381 disposed at an angle of approximately 5° with respect to the plane containing the end portion 376. Each contact clip, such as contact clip 374, terminates in an outer end portion 382 which is disposed at an angle substantially 15° or less with respect to a plane extending through a blade terminal contact point 384 formed between the end portion 382 and the intermediate portion 381 and lying generally parallel to the plane containing the end portion 376 of the contact clip 374.

As shown in FIG. 22, a slot 386 is formed in each contact clip 372 and 374 and extends from the outer end portion 382 to a closed end approximate the flat end portion 376. The slot 386 divides each contact clip 372 and 374 into two finger-like contact portions.

Means are provided for biasing each contact clip 372 and 374 toward each other with sufficient force to releasably and securely hold a blade terminal 18 of a watthour meter 12 or other electrical device therebetween in a secure electrical connection. The biasing means preferably comprises first and second spring clips 390 and 392, respectively. One spring clip is provided for each contact clip. Each spring clip 390 and 392 is formed of a suitable biasing material, such as SAE1060 spring steel which is heat treated to 42–44Rc and then coated with a corrosion resistant material such as zinc.

As shown in FIGS. 24 and 25, each spring clip, such as spring clip 390, is formed with a flat, central portion 394. At least one and preferably a pair of apertures 396 are formed through the juncture of the central portion 394 and an angled first end 395 and alignable with the apertures 378 in the contact clips 372, 374 and the bores in the first end 344 of the conductor 340. Rivets 398 are mountable through the aligned apertures to fixedly connect the spring clips 390 and 392 and the contact clips 372 and 374 to the first end 344 of each conductor 340.

The first end 395 of each spring clip, such as spring clip 390, is bent or otherwise formed at a predetermined angle from the central portion 394. In a preferred embodiment, the first end is disposed at an angle of approximately 15° from the central portion 394. When the spring clip 390 is mounted in engagement with the contact clip 374, the first end 395 first engages the flat end portion 376 of the contact clip 374. The central portion 394 of the spring clip 390 will initially be spaced from the contact clip 374 until the rivet 398 forcibly urges and deforms the first end 395 of the spring clip 390 into engagement with the contact clip 374 bringing the central portion 394 of the spring clip 390 into registry with the flat end portion 376 of the contact clip 374. This increases the biasing force exerted on the first end 395 of the spring clip 390 to form a secure connection between the contact clips 372 and 374 and the mating first end 344 of the conductor 340 inserted therebetween.

Each spring clip 390 and 392 further includes a second intermediate angled portion 400 which extends from an opposite end of the central portion 394. The second angled portion 400 is also disposed at a predetermined angle from the plane containing the central portion 394. Preferably, this angle is substantially 15° from the plane containing the central portion 394. Finally, each spring clip, such as spring clip 390, is formed with an angularly disposed second end portion 402 which is disposed at an angle of approximately 30° from the juncture of the second end portion 402 and the second angled portion 400. This juncture point 404 forms a contact point in which the spring clip 390 forcibly engages the contact clip 374.

As noted above, the mounting of the rivets 398 through the aligned apertures in the contact clips 372, 374, the spring clips 390, 392 and the first end 344 of the conductor 340 deforms the spring clips 390 and 392 into forced engagement with the contact clips 372 and 374. This increases the closure force urging the contact clips 372 and 374 together so as to enable the contact clips 372 and 374 to form a secure connection with a blade terminal 18 of an electrical device, such as a watthour meter 12, inserted therebetween. The use of rivets 398 with the spring clips 390 and 392 provides a more reliable, dynamic and secure mounting of the jaw contact 370 on the conductor 340 as compared to the prior art method of securing jaw contacts to the conductors by means of threaded fasteners which are static with regard to construction and material and frequently loosen due to material creep caused by time and temperature changes.

As shown in FIGS. 22 and 25, each jaw contact 370 has, aside from the angular portions, a generally elongated, planar shape. This compares advantageously with the prior art construction of folded over jaw contacts. The predetermined angular disposition of the outer ends 382 of the contact clips 372 and 374 at an angle of substantially 15° or less with respect to the juncture of the outer end portions 382 and the immediately adjacent angled portion 381, minimizes the amount of force required to insert the blade terminals of a watthour meter or other electrical device into electrical connection with the jaw contacts 370. At the same time, the amount of force required to separate the blade terminals from the jaw contacts 370 is also reduced as compared to prior art watthour meter jaw contact constructions since the jaw contacts 370 do not tend to pull inward toward each other during the removal of the blade terminal therefrom.

Figure 37:
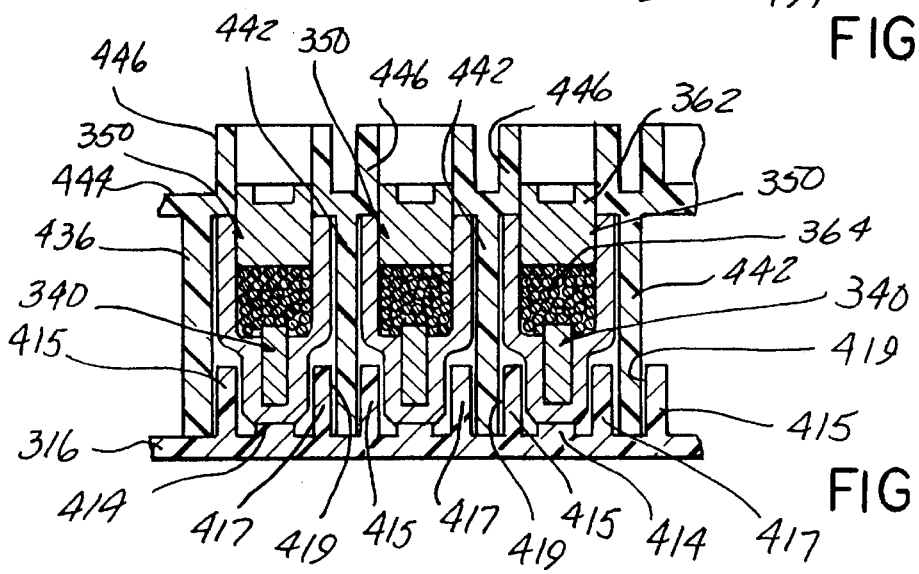
FIG. 37 is a cross sectional view generally taken through line 37—37 in FIG. 33.

As shown in FIG. 37, the terminals 350 are mounted in the terminal portion of the adapter 310, with each terminal 350 disposed between a pair of dividers 442. In this mounting arrangement, the threaded fasteners 362 face outward as per FIG. 23 to attach an electrical line or load power conductor to each terminal 350.

As also shown in FIG. 37, a pair of short terminal dividers 415 and 417 are integrally formed on the base 316 of the rear housing portion 312 and extend outward therefrom on opposite sides of each terminal support surface 414. Each pair of short terminal dividers 415 and 417 are spaced apart to receive and locate the second lower position 356 of a terminal 350. In addition, each pair of short terminal dividers 415 and 417 is disposed between two adjacent longer dividers 442 on the front housing portion 314. The lengths of the dividers 442, 415 and 417 are chosen such that one short divider 415 or 417 of each pair of short terminal dividers cooperates with one of the short dividers 417 or 415 of the adjacent pair of short dividers to form a slot 419 therebetween which receives the end of a longer divider 442 therebetween. This arrangement forms an enlarged insulation barrier between adjacent terminals 350. Further, since only the longer dividers 442 surround the upper portion of each terminal 350, the upper portion of each terminal 350 may be enlarged as compared to the smaller lower portion 356 thereof to receive a larger diameter external conductor 364.

The conductors 340 extend in a predetermined angular arrangement, usually different for each conductor 340, from its associated terminal 350 to its associated jaw contact 370. The jaw contacts 370 attached to the first end 344 of each conductor 340 are loosely disposed in one of the hollow receptacles 422 formed in the base 420 of the front housing portion 314, with the opening between the jaw contact clips 372 and 374 substantially aligned with the slot in the receptacle 422 so as to slidably receive the blade terminal 18 of a watthour meter 12 or other electrical device therein.

Figure 29:
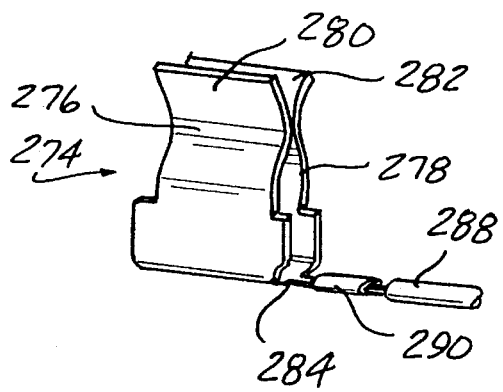
FIG. 29 is a perspective view of one embodiment of a current terminal mountable in a current transformer type socket adapter.

A plurality of current contacts are alternately mountable in the receptacles 142 or 422 and are each connectible to the current leads of a current transformer, not shown, which is mounted in or external to the socket adapter housing. A first embodiment of such a current contact 274 is depicted in FIG. 29. In this embodiment, the current contact 274 includes a pair of angularly bent side walls 276 and 278 which terminate in a pair of oppositely, outwardly extending end portions 280 and 282, respectively. A base 284 interconnects the opposite ends of the side walls 276 and 278. A lead crimp collar 286 is integrally formed with the base 284 and extends therefrom for receiving the end of a current wire 288 which is connected to terminals in the terminal portion of the adapter. The opening between the ends 280 and 282 of each current contact 274 is alignable with the slot 150 in one of the receptacles 142 so as to slidably receive an external lead therethrough. However, in this mounting arrangement, the side walls and the end wall of each receptacle 142 substantially encloses all of the current contact 274 to provide a safety or flash shield completely thereabout.

Figure 30:
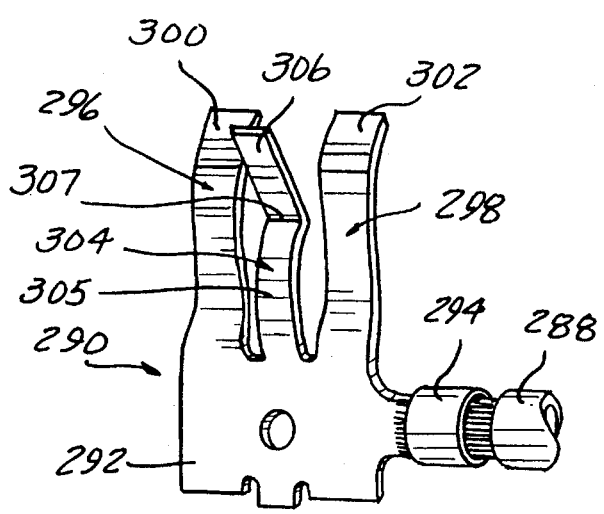
FIG. 30 is an enlarged, perspective view of another embodiment of a current terminal.
Figure 31:
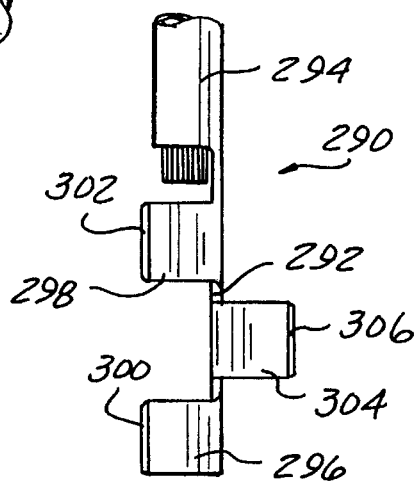
FIG. 31 is a plan view of the current terminal shown in FIG. 30.
Figure 39:
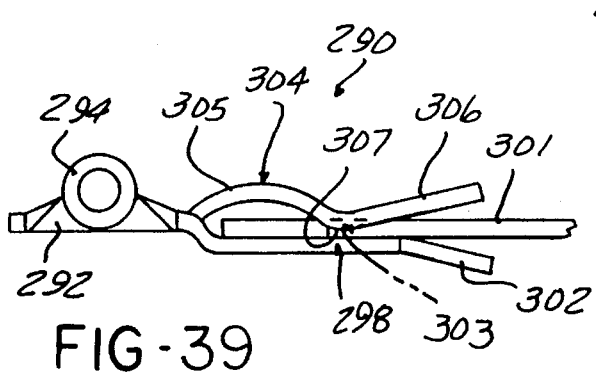
FIG. 39 is a right end view of the current terminal shown in FIG. 30.

Another embodiment of a current contact usable in the present invention is shown in FIGS. 30, 31 and 39. In this embodiment, the current contact 290 comprises a planar end 292 from which extends a wire crimp collar 294. The collar 294 receives the end of a current lead 288. A plurality of jaws extends from the end portion 292. A first jaw is formed of spaced legs 296 and 298 which have the same angularly bent shape and terminate in end portions 300 and 302, respectively, which are disposed at an approximate 15° angle with respect to the main extent of each leg 296 and 298 and which extend outward in a first direction from the plane in which the end portion 292 lays. The legs 296 and 298 are spaced apart and have an intermediate leg 304 interposed therebetween. The leg 304 is formed with a curved position 305 extending from the planar end 292 and a planar, angularly disposed outer end portion 306 which extends outward in an opposite direction with respect to the plane in which the end portion 292 lays from the end portions 300 and 302 of the legs 296 and 298. The legs 296, 298 and 304 combine to form a jaw contact for receiving an external lead therein.

As shown in FIG. 39, the intermediate leg 304 is formed to be more flexible than the legs 296 and 298. This is preferably achieved by forming the leg 304 of a smaller width than the width of the legs 296 and 298. In addition, the end portion 306 of the leg 304 is preferably disposed at an approximate 15° angle from the plane of the planar end portion 292. The curved portion 305 extends from the juncture 307 of the portions 305 and 306 at an angle of greater than 15° from the plane of the end portion 292. This provides a low blade terminal insertion force and a higher pull out force.

The juncture 307 on the intermediate leg 304 acts as a detent when it engages a center aperture 303 in a blade terminal 301 inserted into the current contact 290 as shown in FIG. 39. The resiliency of the leg 304 enables the leg 304 to flex or bend sufficiently to receive or allow the withdrawal of the blade terminal 301, while lockingly retaining the blade terminal 301.

In summary, there has been disclosed a unique electrical watthour meter apparatus having a unique safety shield which completely surrounds all of the exposed portions of the jaw contacts mounted within the electrical watthour meter mounting apparatus. The safety shield may be formed as part of a two-part socket adapter in which a number of receptacles are formed in the base of a front housing portion to loosely receive the jaw contacts attached to one end of an electrical conductor. Besides providing the desired safety and flash shield features, this construction also enables the jaw contacts to be mounted in the socket adapter without the need for fasteners or other fixed connections previously used to mount such jaw contacts on the base of the socket adapter. In another embodiment, the safety shield is provided as a separate component mountable to the base of the housing of an electrical watthour meter apparatus, such as a socket adapter, socket extender or even a watthour meter socket itself. This safety shield is provided with one large internal hollow receptacle or a number of separate smaller hollow receptacles, all designed to completely enclose the jaw contacts mounted in the housing while allowing the slidable insertion of a blade terminal of a watthour meter through an end wall of each receptacle into the jaw contact housed therein.

The unique construction of the conductors mounted in the adapter of a rigid bus bar increases the current capacity of the conductors. In addition, a uniquely designed jaw contact formed of separate contact clips is fixedly mounted by means of rivets to one end of each conductor, with the contact clips biased toward each other by means of separate spring clips, also riveted to the conductors, to form a reliable, dynamic, secure electrical connection between the jaw contacts and the mating blade terminals of an electrical apparatus inserted therebetween and to the conductor to which the spring clips and contact clips are mounted. At the same time, the elongated, separate construction of the jaw contacts substantially reduces the blade terminal insertion and withdrawal forces as compared to folded over jaw contact designs commonly employed in watthour meter adapters.

What is claimed is:

1. A watthour meter socket adapter for use with a watthour meter having a plurality of blade terminals, the socket adapter comprising:
   a housing, the housing including:
      a watthour meter receiving portion; and
      a terminal portion spaced from the watthour meter receiving portion;
   a plurality of electrical terminals mounted in the terminal portion of the housing;
   a plurality of electrical contacts mounted in the watthour meter receiving portion of the housings each contact receiving one blade terminal of a watthour meter in a snap-in connection;
   a plurality of electrical terminals disposed in the terminal portion of the housing and receiving one of an external electrical power line conductor and an electrical load conductor connected to an external load;
   electrical conductors connected to and extending between one contact and one terminal in the housing; and
   means, formed in the housing, for covering substantially all of the electrical conductors and the electrical contacts in the housing, the covering means including the watthour meter receiving portion formed of first and second plates and an annular sidewall extending between the first and second plates, the first and second plates being spaced apart to define a cavity therebetween, the electrical conductors and the electrical contacts being disposed in the cavity and substantially enclosed by the first and second plates and the annular sidewall.

2. The watthour meter socket adapter of claim 1 wherein:
   the housing is formed of an electrically insulating material.

3. The watthour meter socket adapter of claim 1 wherein the covering means further comprises:
   a plurality of hollow receptacles formed in the first plate and extending outward from the first plate, the interior of the receptacles opening to the cavity between the first and second plates;
   at least one of the plurality of electrical contacts being disposed in each receptacle; and
   an aperture formed in each receptacle for receiving a terminal of a watthour meter therethrough into electrical contact with the electrical contact disposed within the receptacle.

4. The watthour meter socket adapter of claim 3 wherein:
   each electrical contact is loosely disposed in a receptacle.

5. The watthour meter socket adapter of claim 3 wherein each receptacle comprises:
   a plurality of joined side walls extending from the first plate and terminating in an outer end wall;
   the joined side walls and the end wall forming a hollow receptacle therebetween for receiving an electrical contact therein; and
   the aperture being formed in the end wall.

6. The watthour meter socket adapter of claim 5 wherein:
   at least certain edges of the end wall surrounding the aperture tapering inward from the exterior surface of the end wall toward the aperture.

7. The watthour meter socket adapter of claim 3 wherein:
   each receptacle has walls extending from the first plate; and
   at least one of the walls having an angled edge tapering from the exterior surface of the receptacle toward the aperture.

8. The watthour meter socket adapter of claim 1 further comprising:
   means for releasably joining the first and second plates together.

9. The watthour meter socket adapter of claim 8 wherein:
   the terminal portion of the housing includes first and second terminal portions extending integrally from the first and second plates respectively;
   the joining means comprising:
      a pair of flanges formed on the second terminal portion, each having an aperture formed therein; and
      a pair of clips mounted in the first terminal portion, each clip having an end flange releasably engagable with the aperture in the flange on the second terminal portion.

10. The watthour meter socket adapter of claim 1 further comprising:
    the annular wall formed on and extending outward from the second plate;
    a discontinuity formed in the annular wall and extending over a predetermined angular extent of the wall;
    the discontinuity and the side wall being disposed adjacent a terminal receiving portion of the first plate; and
    annular flange means formed on the terminal portion of the first plate for forming a continuous extension of the side wall and filling the discontinuity in the side wall when the first and second plates are joined together.

11. The watthour meter socket adapter of claim 10 wherein the annular flange means comprises:
    a first annular flange integrally formed with the first plate adjacent the terminal portion of the first plate;
    a second annular flange releasably engagable with the first annular flange, the first and second annular flanges completely filling the discontinuity in the side wall; and
    means for releasably joining the first and second annular flanges together.

12. The watthour meter socket adapter of claim 1 wherein each electrical contact comprises:
    a jaw contact formed of a base, a pair of side walls extending from the base and a pair of inward and downwardly extending legs extending from the side walls, the legs forming a slot therebetween for receiving a blade terminal of a watthour meter in a snap-in connection; and further including
    one end of the electrical conductors being fixedly connected to the base of the jaw contact, the other end of the electrical conductors being connected to one of the electrical terminals.

13. The watthour meter socket adapter of claim 1 wherein:
    the plurality of electrical conductors are disposed in one plane between the electrical contacts and the electrical terminals.

14. The watthour meter socket adapter of claim 13 further comprising:
    means, formed in at least one of the first and second plates, for electrically insulating adjacent conductors from each other, the electrically insulating means including a first flange formed on one of the first and second plates and extending toward the other of the first and second plates when the first and second plates are joined together.

15. The watthour meter socket adapter of claim 14 wherein the electrical insulating means further comprises:

a second flange formed on the other of the first and second plates and extending toward the one of the first and second plates when the first and second plates are joined together; and the first and second flanges being disposed in close proximity to each other when the first and second plates are joined together to form a barrier between adjacent electrical conductors.

16. The watthour meter socket adapter of claim 15 wherein:

outer ends of the first and second flanges are spaced from the opposed ones of the first and second plates; and the first and second flanges are spaced from each other to form an elongated path between electrical conductors disposed adjacent to each of the first and second flanges.

17. The watthour meter socket adapter of claim 15 further comprising:

a plurality of pairs of first and second flanges formed on the first and second plates, each pair of first and second flanges electrically insulating two of the plurality of adjacent electrical conductors from each other.

18. The watthour meter socket adapter of claim 14 wherein:

the plurality of electrical conductors comprise bare conductors.

19. The watthour meter socket adapter of claim 1 wherein the terminal portion comprises:

a plurality of spaced dividers formed on the first plate; and a cavity formed between two adjacent dividers for receiving one of the plurality of electrical terminals therein.

20. The watthour meter socket adapter of claim 19 further comprising:

a plurality of pairs of short terminal dividers formed on and extending outward from the second plate, each pair of short terminal dividers being spaced apart to receive a lower portion of an electrical terminal therebetween;

one short terminal divider of each pair of short terminal dividers being spaced from one short terminal divider of an adjacent pair of short terminal dividers to form a slot therebetween and receiving one end of one of the dividers on the first plate therein.

21. The watthour meter socket adapter of claim 20 wherein the terminals comprise:

a collar having first and second portions integrally formed as a one-piece, unitary member;

the first portion having a first through bore extending therethrough sized to receive an external electrical conductor therein;

means for securing an external electrical conductor in the first bore of the collar;

the second portion having a second through bore extending therethrough for slidably receiving a first end of the electrical conductor, the second bore disposed in communication with the first bore;

the second portion being smaller in width than the first portion;

the short terminal dividers receiving the second portion of one of the terminals therebetween.

22. The watthour meter socket adapter of claim 19 further comprising:

a plurality of hollow, tubular bosses formed on the first plate and extending outward from the cavities on the first plate, the tubular bosses opening to the cavities.

23. The watthour meter socket adapter of claim 22 further comprising:

inward extending flanges formed on each end of the dividers for releasably retaining one of the plurality of electrical terminals between two adjacent dividers.

24. The watthour meter socket adapter of claim 22 further comprising:

a terminal cover mounted over and covering the ends of the tubular bosses on the first plate; and means for releasably mounting the terminal cover on the first plate.

25. The watthour meter socket adapter of claim 24 wherein the releasable mounting means comprises:

a pin mounted on and extending from the first terminal portion of the first plate;

a leg mounted on an outer end of the pin and extending laterally of the pin;

an aperture formed in the terminal cover;

a flange formed on the terminal cover extending a predetermined distance across the aperture; and the flange and the leg on the pin cooperating to provide a solid surface on the terminal cover covering the aperture when the terminal cover is mounted over the pin.

26. The watthour meter socket adapter of claim 24 further comprising:

means for releasably locking the terminal cover on the first section of the terminal portion.

27. The watthour meter socket adapter of claim 1 wherein the electrical conductors are polygonal shaped bus bars each having a rectangular cross section formed of two major exterior surfaces of a first length and two minor end exterior surfaces of a second smaller length, the two major exterior surfaces of the electrical conductors being co-planarly aligned with the axial extent of the blade terminals of a watthour meter insertable into the housing.

28. The watthour meter socket adapter of claim 27 wherein the bus bars are rigid.

29. The watthour meter socket adapter of claim 27 wherein the terminals comprise:

a collar having first and second portions integrally formed as a one-piece, unitary member;

the first portion having a first through bore extending therethrough sized to receive an external electrical conductor therein; and means for securing an external electrical conductor in the first bore of the collar.

30. The watthour meter socket adapter of claim 29 wherein the terminals further comprise:

the second portion having a second through bore extending therethrough for slidably receiving a first end of the electrical conductor, the second bore disposed in communication with the first bore.

31. The watthour meter socket adapter of claim 29 wherein the securing means comprises:

an aperture formed in the first portion of the collar;

the fastener threadingly extendible through the aperture into engagement with an external conductor inserted into the first bore in the first portion of the collar.

32. The watthour meter socket adapter of claim 29 wherein the securing means comprises:

a pair of spaced, co-axial apertures formed in the first portion of the collar;

a fastener threadingly extendible through each aperture into engagement with an external electrical conductor inserted into the first bore in the first portion of the collar.

33. The watthour meter socket adapter of claim 30 wherein:

a height of the first end of the electrical conductor is greater than a height of the second bore in the collar such that an upper portion of the first end of the electrical conductor extends into the first bore in the collar.

34. The watthour meter socket adapter of claim 29 wherein the electrical conductor has a first step spaced from the first end and engageable with the second portion of the collar to limit the length insertion of the conductor into the second bore of the collar.

35. The watthour meter socket adapter of claim 34 wherein the conductor has a second step spaced from the first end of the conductor, the second step extending transversely with respect to the end of the first through bore in the first portion of the collar, when the conductor is mounted in the collar, to limit the length of insertion of an external electrical conductor through the first bore in the collar.

36. A watthour meter socket adapter for use with a watthour meter having a plurality of blade terminals, the socket adapter comprising:

a housing, the housing including:
 a watthour meter receiving portion; and
 a terminal portion spaced from the watthour meter receiving portion;
a plurality of electrical terminals mounted in the terminal portion of the housing;
a plurality of electrical contacts mounted in the watthour meter receiving portion of the housing, each contact receiving one blade terminal of a watthour meter in a snap-in connection;
a plurality of electrical terminals disposed in the terminal portion of the housing and receiving one of an external electrical power line conductor and an electrical load conductor connected to an external load;
electrical conductors connected to and extending between one contact and one terminal in the housing, each electrical conductor having opposed side surfaces extending co-planarly with an axial extent of a blade terminal of a watthour meter;
each of the electrical contacts including:
 first and second spaced, separate contact clips, each having a first end portion disposed in registry with one of the side surfaces of one of the electrical conductors and a second jaw portion;
 biasing means, engageable with an outer surface of each of the first and second contact clips, for biasing the jaw portion of each of the first and second contact clips toward each other; and
 means for fixedly joining the first and second contact clips and the biasing means to each of the electrical conductors; and
means, formed in the housing, for covering substantially all exposed surfaces of the electrical conductors and the electrical contacts in the housing.

37. The watthour meter socket adapter of claim 36 wherein each of the first and second contact clips further comprises:

the second jaw portion being integral and continuous with the first end portion and bending in a first direction from the first end portion and then in a second direction toward a plane containing the first end portion.

38. The watthour meter socket adapter of claim 36 wherein the first and second contact clips each comprise:

a plate-like member having a planar first end portion, an intermediate portion extending at a predetermined angle from the plane containing the first end portion; and a second end portion extending at a predetermined angle from an end of the intermediate portion.

39. The watthour meter socket adapter of claim 38 wherein:

a conductor contacting edge is formed at the juncture of an end of the intermediate portion and the second end portion of each of the first and second contact clips.

40. The watthour meter socket adapter of claim 38 wherein:

the second end portion extends at an angle less than or equal to substantially 15° from a plane extending parallel to a plane containing the first end portion and through the juncture of the end of the intermediate portion and the second end portion of each of the first and second contact clips.

41. The watthour meter socket adapter of claim 38 wherein the biasing means comprises:

first and second spring clips, respectively disposed in registry with the outer surface of the first and second contact clips.

42. The watthour meter socket adapter of claim 41 wherein the first and second contact clips each comprise:

a plate-like member having:
 a planar central portion;
 a first end portion extending at a predetermined angle from one end of the central portion;
 an intermediate portion extending at a predetermined angle from an opposite end of the central portion in the same direction away from a plane containing the central portion as the first end portion; and
 a second end portion extending at a predetermined angle from an end of the intermediate portion toward the plane containing the central portion.

43. The watthour meter socket adapter of claim 42 wherein the first end portion is at a substantially 15° angle with respect to the central portion.

44. The watthour meter socket adapter of claim 43 wherein the intermediate portion is at a substantially 15° angle from the central portion.

45. The watthour meter socket adapter of claim 44 wherein the second end portion is at a substantially 30° angle from the end of the intermediate portion.

46. The watthour meter socket adapter of claim 41 wherein:

a slot is formed in each of the first and second spring clips extending from the second end portion to the central portion and dividing the second end and the intermediate portions into two spaced portions.

47. The watthour meter socket adapter of claim 41 wherein the joining means comprises:

aligned apertures formed in the second end of the electrical conductor, the first and second spring clips and the first and second contact clips;

rivets fixedly mounted in the aligned apertures to force the central portion and the first end portion of the first and second spring clips into substantial registry with the first and second contact clips, respectively, and the first and second contact clips into registry with opposed surfaces of the second end of the electrical conductor to forcibly bias the first and second spring clips into engagement with the first and second contact clips, respectively, to urge the second end portions of the first and second contact clips toward each other.

48. The watthour meter socket adapter of claim 41 further comprising:

means for joining the first and second spring clips and the first and second contact clips, respectively, to the second end of each conductor.

49. The watthour meter socket adapter of claim 1 wherein:

the first plate is formed of a transparent material.

50. A watthour meter socket adapter for use with a watthour meter having a plurality of blade adapter comprising:

a housing formed of first and second plates, each of the first and second plates being formed of an electrically insulating material;

means for releasably joining the first and second plates together;

each of the first and second plates having a watthour meter receiving portion and a terminal mounting portion;

the watthour meter receiving portion of the first and second plates being spaced apart when the first and second plates are joined together to form a cavity therebetween;

a plurality of electrical terminals mounted between the terminal portions of the first and second plates;

a plurality of electrical contacts mounted in the watthour meter receiving portion of the first plate, each electrical contact receiving a blade terminal of a watthour meter in a snap-in connection;

a plurality of electrical conductors, each connected to one of the electrical contacts and one of the electrical terminals and completely disposed in the cavity between the watthour meter receiving portions of the first and second plates;

a side wall formed on and extending from one of the first and second plates and substantially completely surrounding the cavity and the electrical contacts and the electrical conductors disposed therein when the first and second plates are joined together;

terminal cover means, mounted on the terminal mounting portion of the first plate, for covering the electrical connections of the electrical terminals in the housing to the electrical conductors in the housing and to external electrical conductors; and means for releasably joining the terminal cover to the terminal mounting portion of the first plate.

51. The watthour meter socket adapter of claim 50 further comprising:

a plurality of hollow receptacles formed in the first plate and extending outward from the first plate, the interior of the receptacles opening to the cavity between the first and second plates;

at least one of the plurality of electrical contacts being disposed in each receptacle; and an aperture formed in each receptacle for receiving a terminal of a watthour meter therethrough into electrical contact with the electrical contact disposed within the receptacle.

52. The watthour meter socket adapter of claim 51 wherein each receptacle comprises:

a plurality of joined side walls extending from the first plate and terminating in an outer end wall;

the joined side walls and the end wall forming a hollow receptacle therebetween for receiving an electrical contact therein; and the aperture being formed in the end wall.

53. The watthour meter socket adapter of claim 51 wherein:

at least certain edges of the end wall surrounding the aperture tapering inward from the exterior surface of the end wall toward the aperture.

54. The watthour meter socket adapter of claim 51 wherein:

each receptacle has walls extending from the first plate; and at least one of the walls having an angled edge tapering from the exterior surface of the receptacle toward the aperture.

55. The watthour meter socket adapter of claim 50 wherein the joining means comprises:

at least one flange formed on the terminal portion of the second plate, the at least one flange having an aperture therein;

at least one clip mounted on the terminal portion of the first plate, the at least one clip having an end flange releasibly engagable in a snap engagement with the aperture in the flange on the second plate.

56. The watthour meter socket adapter of claim 50 wherein the releasibly mounting means comprises:

a pair of flanges formed on the terminal portion of the first plate, each having an aperture formed therein; and a cylindrical boss mounted on and extending outward from each side of the terminal portion of the second plate, each cylindrical boss having a through bore alignable with the aperture in the flange on the terminal portion of the first plate.

57. The watthour meter socket adapter of claim 56 wherein:

a mounting pin is mounted on and extends outward from each side of the terminal cover, each pin releasibly engagable with the aligned aperture in the first plate and the cylindrical boss in the second plate.

58. The watthour meter socket adapter of claim 50 further comprising:

the annular wall formed on and extending outward from the second plate;

a discontinuity formed in the annular wall and extending over a predetermined angular extent of the wall;

the discontinuity in the side wall being disposed adjacent a terminal receiving portion of the first plate.

a pair of spaced first annular flanges integrally formed with the first plate adjacent the terminal portion of the first plate;

a second annular flange releasibly engagable with the pair of first annular flanges, the first and second annular flanges completely filling the discontinuity in the side wall; and means for releasibly joining the pair of first annular flanges and the second annular flange together.

59. The watthour meter socket adapter of claim 58 wherein the releasible joining means comprises:

the second annular flange has opposed side ends;

the annular wall on the second plate having opposed side ends; and mating interconnectible tongue and groove formed on the side ends of the second annular flange and the second plate.

60. The watthour meter socket adapter of claim 58 wherein the terminal cover comprises:

a front wall with spaced integral side walls extending therefrom; and an arcuate edge formed on the front wall between the spaced side walls, the arcuate edge overlapped with the second annular flange when the terminal cover is mounted on the terminal portion of the first plate.

61. The watthour meter socket adapter of claim 58 wherein the means for releasibly joining the pair of first annular flanges and the second annular flanges comprises:

the pair of first annular flanges including a plurality of spaced slots opening outwardly from the first plate; and the second annular flange including a plurality of spaced slots alignable with the slots in the pair of first annular flanges when the second flange is mounted on the pair of first annular flanges to form apertures opening between the watthour meter receiving portion and the terminal portion of the first plate.

62. The watthour meter socket adapter of claim 61 wherein the terminal cover includes:

a front wall and integrally spaced side walls extending therefrom, the side walls mountable over the terminal receiving portion of the first plate;

the front wall of the terminal cover being spaced from the first plate when the terminal cover is mounted on the first plate to form an opening therebetween communicating with the apertures formed by the interconnected pair of first annular flanges and the second annular flange.

63. The watthour meter socket adapter of claim 62 wherein:

a radially extending flange extending perpendicularly from the second annular flange;

a recessed edge formed on a peripheral edge of the radially extending flange;

the front wall of the terminal cover terminating in an annular edge, the annular edge seated on the recessed edge.

64. The watthour meter socket adapter of claim 62 wherein the terminal cover further comprises:

at least one raised portion formed on and projecting outward from the front wall of the terminal cover, the raised portion forming an interior channel opening toward the first plate when the terminal cover is mounted on the first plate.

65. The watthour meter socket adapter of claim 64 wherein the terminal cover includes a pair of spaced apart raised portions formed on the front wall of the terminal cover, each raised portion forming an interior channel.

66. The watthour meter socket adapter of claim 50 wherein:

the first plate is formed of a transparent, electrically insulating material.

67. The watthour meter socket adapter of claim 50 wherein each electrical contact comprises:

a jaw contact formed of a base, a pair of side walls extending from the base and a pair of inward and downwardly extending legs extending from the side walls, the legs forming a slot therebetween for receiving a blade terminal of a watthour meter in a snap-in connection; and further including one end of each electrical conductor being fixedly connected to the base of the jaw contact, the other end of each electrical conductor being connected to one of the electrical terminals.

68. The watthour meter socket adapter of claim 50 wherein:

the plurality of electrical conductors are disposed in one non-overlapping plane between the electrical contacts and the electrical terminals and the first and second plates.

69. The watthour meter socket adapter of claim 68 further comprising:

means, formed in at least one of the first and second plates, for electrically insulating adjacent conductors from each other.

70. The watthour meter socket adapter of claim 69 wherein the electrical insulating means comprises:

a first flange formed on one of the first and second plates and extending toward the other of the first and second plates when the first and second plates are joined together.

71. The watthour meter socket adapter of claim 68 wherein the electrical insulating means comprises:

a first flange formed on one of the first and second plates and extending toward the other of the first and second plates when the first and second plates are joined together;

a second flange formed on the other of the first and second plates and extending toward the one of the first and second plates when the first and second plates are joined together; and the first and second flanges being disposed in close proximity to each other when the first and second plates are joined together to form a barrier between adjacent electrical conductors.

72. The watthour meter socket adapter of claim 71 wherein:

outer ends of the first and second flanges are spaced from the opposed ones of the first and second plates; and the first and second flanges are spaced from each other to form an elongated path between electrical conductors disposed adjacent to each of the first and second flanges.

73. The watthour meter socket adapter of claim 71 further comprising:

a plurality of pairs of first and second flanges formed on the first and second plates, each pair of first and second flanges electrically insulating two of the plurality of adjacent electrical conductors from each other.

74. The watthour meter socket adapter of claim 71 wherein:

the plurality of electrical conductors comprise bare conductors.

75. A watthour meter socket adapter for use with a watthour meter having a plurality of blade terminals and an annular mounting flange, the socket adapter comprising:

a housing formed of first and second plates, each of the first and second plates being formed of an electrically insulating material an annular wall extending from the second plate;

means for releasably joining the first and second plates together;

each of the first and second plates having a watthour meter receiving portion and a terminal mounting portion;

the watthour meter receiving portion of the first and second plates being spaced apart when the first and second plates are joined together to form a cavity therebetween;

a plurality of electrical terminals mounted in the terminal portion of the first plate;

a plurality of electrical contacts mounted in the watthour meter receiving portion of the first plate, each electrical contact receiving a blade terminal of a watthour meter in a snap-in connection;

a plurality of electrical conductors, each connected to one of the electrical contacts and one of the electrical terminals and completely disposed in the cavity between the watthour meter receiving portions of the first and second plates;

at least one first annular flange integrally formed with the first plate adjacent the terminal portion of the first plate;

a second annular flange releasably engagable with the first annular flange, the first and second annular flanges completely filling the discontinuity in the side wall;

means for releasably joining the first and second annular flanges together;

a terminal cover releasably mounted on the terminal mounting portion of the first plate and covering electrical connections of the electrical terminals in the housing to the electrical conductors in the housing and to external electrical conductors;

the terminal cover including a front wall and integrally spaced side walls mountable over the terminal receiving portion of the first plate;

a sealing ring mountable about a mounting flange formed on the annular side wall of the second plate and the first and second flanges and a mounting flange on the watthour meter, a lock means mounted on the sealing ring for locking the sealing ring about the annular flange on a watthour meter and the mounting flange on the annular side wall an annular metallic ring mounted on the first plate adjacent to the annular wall extending from the second plate, the annular metallic ring having an angular discontinuity formed between first and second spaced ends; and a flange carried on each of the first and second ends, the flange mountable on and attachable to the first plate.

76. The watthour meter socket adapter of claim 75 further comprising:

a perpendicular flange formed on and extending perpendicularly outward from one of the first and second ends of the annular ring;

the perpendicular flange having an aperture formed therein;

the perpendicular flange located in proximity with the first annular flange on the first plate and the second annular flange when the annular ring is mounted on the first plate and extending through a slot formed in the front wall of the terminal cover;

the lock means on the sealing ring including a flange formed adjacent one end with an aperture formed therein; and a wire seal passable through the aperture in the perpendicular flange exteriorly of the terminal cover and an aperture in a flange on a sealing ring.

77. An adapter mounted in a watthour meter socket having jaw contacts for receiving blade terminals of an electrical apparatus therein in a snap-in connection, the adapter comprising:

a housing having a base and an annular side wall mounted on and extending outward from the base;

a plurality of electrical contacts mounted in the housing, each electrical contact having a jaw contact end matable with a blade terminal of an electrical apparatus and a terminal end matable with a jaw contact in a watthour meter socket; and means, mounted in the housing, for enclosing substantially all exposed front and side surfaces of the contacts mounted therein and for allowing the terminals of an electrical apparatus to be inserted therethrough into the jaw contact end, the means including:

a front portion covering the jaw contact ends; and a side portion, integral with the front portion and covering sides of the jaw contacts, the side portion spaced from the annular side wall of the housing to allow mounting of an electrical apparatus in the housing.

78. The adapter of claim 77 wherein the enclosing means comprises:

a single hollow enclosure formed of an electrically insulating material;

a plurality of apertures formed in the enclosure, each aperture located to be disposed immediately adjacent one of the jaw contacts in the housing and allowing insertion of a blade terminal of an electrical apparatus therethrough into the jaw contact; and means for mounting the enclosure in the housing such that the enclosure surrounds substantially all exposed front and side surfaces of the jaw contacts in the housing.

79. The adapter of claim 78 wherein the mounting means comprises:

a plurality of flanges integrally formed on and extending outward from the enclosure;

the flanges disposed on the base of the housing; and apertures formed in the flanges for receiving fasteners therethrough.

80. The adapter of claim 78 wherein the enclosure comprises:

a plurality of side walls, an open end, and an opposed end wall;

the apertures being formed in at least the end wall;

the open end of the enclosure disposed adjacent the base of the housing when the enclosure is mounted in the housing.

81. The adapter of claim 78 wherein the enclosing means comprises:

a planar wall;

means for mounting the wall to the base of the housing;

a plurality of hollow receptacles formed on the wall and extending outward from the wall; and at least one aperture formed in each receptacle for receiving a blade terminal of an electrical apparatus therethrough, the aperture located adjacent one of the jaw contacts in the housing when the enclosing means is mounted in the housing.

82. The adapter of claim 81 wherein each receptacle comprises:

a plurality of joined side walls and an end wall, the side walls and the end wall forming a hollow chamber surrounding at least one jaw contact when the enclosing means is mounted in the housing; and at least one aperture formed in the end wall of each receptacle.

83. The adapter of claim 81 wherein the mounting means comprises:

a plurality of flanges integrally formed on and extending outward from the planar wall;

the flanges disposed on the base of the housing; and apertures formed in the flanges for receiving fasteners therethrough.

84. The adapter of claim 77 wherein the enclosing means comprises:

a plurality of hollow receptacles formed on the base of the housing and extending outward from the base;

the receptacles each receiving at least one jaw contact therein; and an aperture formed in each receptacle for receiving a blade terminal of an electrical apparatus therethrough into contact with a jaw contact disposed in the receptacle.

85. The adapter of claim 84 wherein each receptacle comprises:

a plurality of joined side walls and an end wall, the side walls and the end wall forming a hollow chamber surrounding at least one jaw contact when the enclosing means is mounted in the housing; and at least one aperture formed in the end wall of each receptacle.

86. A watthour meter socket adapter for use with a watthour meter having a plurality of blade terminals, the socket adapter comprising:

a housing, the housing including:

a watthour meter receiving portion; and a terminal portion spaced from the watthour meter receiving portion;

a plurality of electrical terminals mounted in the terminal portion of the housing;

a plurality of electrical contacts mounted in the watthour meter receiving portion of the housing, each contact receiving one blade terminal of a watthour meter in a snap-in connection;

a plurality of electrical terminals disposed in the terminal portion of the housing and receiving one of an external electrical power line conductor and an electrical load conductor connected to an external load;

an electrical conductor connected to and extending between one contact and one terminal in the housing, the plurality of electrical conductors being bare conductors and disposed in one plane between the electrical contacts and the electrical terminals; and means, formed in the housing, for covering substantially all of the electrical conductors and the electrical contacts in the housing, the covering means including:

a plurality of hollow receptacles formed in the watthour meter receiving portion;

at least one of the plurality of electrical contacts being disposed in each receptacle; and an aperture formed in each receptacle for receiving a terminal of a watthour meter therethrough into electrical contact with the electrical contact disposed within the receptacle.

87. The watthour meter socket adapter of claim 41 wherein:

each of the first and second spring clips has a planar portion adapted to register with one of the first and second contact clips, and a first end portion normally angularly disposed from the planar portion, the first end portion deformed into substantial co-extensive planar alignment with the planar portion when the fixedly joining means joins the first end portion of each of the first and second spring clips to the first and second contact clips.

88. A watthour meter socket adapter for use with a watthour meter having a plurality of blade terminals and an annular mounting flange, the socket adapter comprising:

a housing formed with a watthour meter receiving portion and a terminal mounting portion;

a plurality of electrical terminals mounted in the terminal portion;

a plurality of electrical contacts mounted in the watthour meter receiving portion, each electrical contact receiving a blade terminal of a watthour meter in a snap-in connection;

a plurality of electrical conductors, each connected to one of the electrical contacts and one of the electrical terminals, a terminal cover releasably mounted on the terminal mounting portion and covering electrical connections of the electrical terminals in the housing to the electrical conductors in the housing and to external electrical conductors;

the terminal cover including a front wall and integrally spaced side walls, the side walls mountable over the terminal receiving portion of the first plate;

a sealing ring mountable about a mounting flange formed on an annular side wall of the housing and a mounting flange on a watthour meter mounted on the housing, lock means carried on the sealing ring for lockingly mounting the sealing ring about the mating mounting flanges; and stop means, formed on the terminal cover, for limiting the amount of annular rotation of the lock means of the sealing ring over the terminal cover.

89. The watthour meter socket adapter of claim 88 wherein:

the stop means comprises a pair of stops formed on the front wall of the terminal cover, the lock means movably disposed between the pair of stops.

90. The watthour meter socket adapter of claim 88 wherein the stop means comprises:

a raised portion formed integrally with the front wall of the terminal cover and extending outward therefrom.

* * * * *